(12) United States Patent
Liu et al.

(10) Patent No.: US 12,243,871 B2
(45) Date of Patent: Mar. 4, 2025

(54) INTEGRATED CIRCUITS WITH CAPACITORS

(71) Applicant: Taiwan Semiconductor Manufacturing Co., Ltd., Hsin-Chu (TW)

(72) Inventors: Hsiao-Han Liu, Miaoli County (TW); Hoppy Lee, Hsinchu (TW); Chung-Yu Chiang, Changhua County (TW); Po-Nien Chen, Miaoli County (TW); Chih-Yung Lin, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 18/171,530

(22) Filed: Feb. 20, 2023

(65) Prior Publication Data

US 2023/0207320 A1 Jun. 29, 2023

Related U.S. Application Data

(63) Continuation of application No. 17/114,108, filed on Dec. 7, 2020, now Pat. No. 11,587,790, which is a continuation of application No. 16/183,113, filed on Nov. 7, 2018, now Pat. No. 10,861,928.

(60) Provisional application No. 62/732,877, filed on Sep. 18, 2018.

(51) Int. Cl.
| | | |
|---|---|---|
| H01L 27/07 | (2006.01) | |
| H01L 21/033 | (2006.01) | |
| H01L 21/768 | (2006.01) | |
| H01L 21/8234 | (2006.01) | |
| H01L 29/66 | (2006.01) | |
| H01L 49/02 | (2006.01) | |

(52) U.S. Cl.
CPC ...... *H01L 27/0733* (2013.01); *H01L 21/0337* (2013.01); *H01L 21/76829* (2013.01); *H01L 21/823431* (2013.01); *H01L 21/823468* (2013.01); *H01L 21/823481* (2013.01); *H01L 28/60* (2013.01); *H01L 29/66545* (2013.01)

(58) Field of Classification Search
None
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |

(Continued)

*Primary Examiner* — Feifei Yeung Lopez
(74) *Attorney, Agent, or Firm* — HAYNES AND BOONE, LLP

(57) ABSTRACT

Examples of an integrated circuit with a capacitor structure and a method for forming the integrated circuit are provided herein. In some examples, an integrated circuit device includes a substrate and a trench isolation material disposed on the substrate. An isolation structure is disposed on the trench isolation material. A first electrode disposed on the isolation structure, and a second electrode disposed on the isolation structure. A capacitor dielectric is disposed on the isolation structure between the first electrode and the second electrode. In some such examples, the isolation structure includes a first hard mask disposed on the trench isolation material, a dielectric disposed on the first hard mask, and a second hard mask disposed on the dielectric.

20 Claims, 25 Drawing Sheets

(56) References Cited

U.S. PATENT DOCUMENTS

| | | |
|---|---|---|
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,564,428 B1 | 2/2017 | Basker et al. |
| 9,576,814 B2 | 2/2017 | Wu et al. |
| 9,824,934 B1 * | 11/2017 | Bi ................... H01L 29/66666 |
| 10,861,928 B2 | 12/2020 | Liu et al. |
| 2006/0003596 A1 * | 1/2006 | Fucsko ............ H01L 21/76826 |
| | | 438/758 |
| 2007/0004113 A1 | 1/2007 | King et al. |
| 2011/0039381 A1 | 2/2011 | Son et al. |
| 2011/0193178 A1 * | 8/2011 | Chang ................ H01L 29/7853 |
| | | 257/E29.104 |
| 2014/0203370 A1 * | 7/2014 | Maeda ............. H01L 29/66795 |
| | | 257/365 |
| 2014/0346595 A1 | 11/2014 | Taketani |
| 2015/0035023 A1 * | 2/2015 | Kim .................. H01L 29/66795 |
| | | 257/288 |
| 2016/0268391 A1 | 9/2016 | Zhang et al. |
| 2017/0154967 A1 * | 6/2017 | Huang ................ H01L 27/0886 |
| 2017/0159176 A1 * | 6/2017 | Zhang ................ C23C 16/45536 |
| 2018/0096989 A1 | 4/2018 | Bi et al. |
| 2019/0067131 A1 | 2/2019 | Liaw |
| 2019/0165145 A1 * | 5/2019 | Ghani ............. H01L 21/823878 |
| 2020/0091277 A1 | 3/2020 | Liu et al. |
| 2021/0091172 A1 | 3/2021 | Liu et al. |

\* cited by examiner

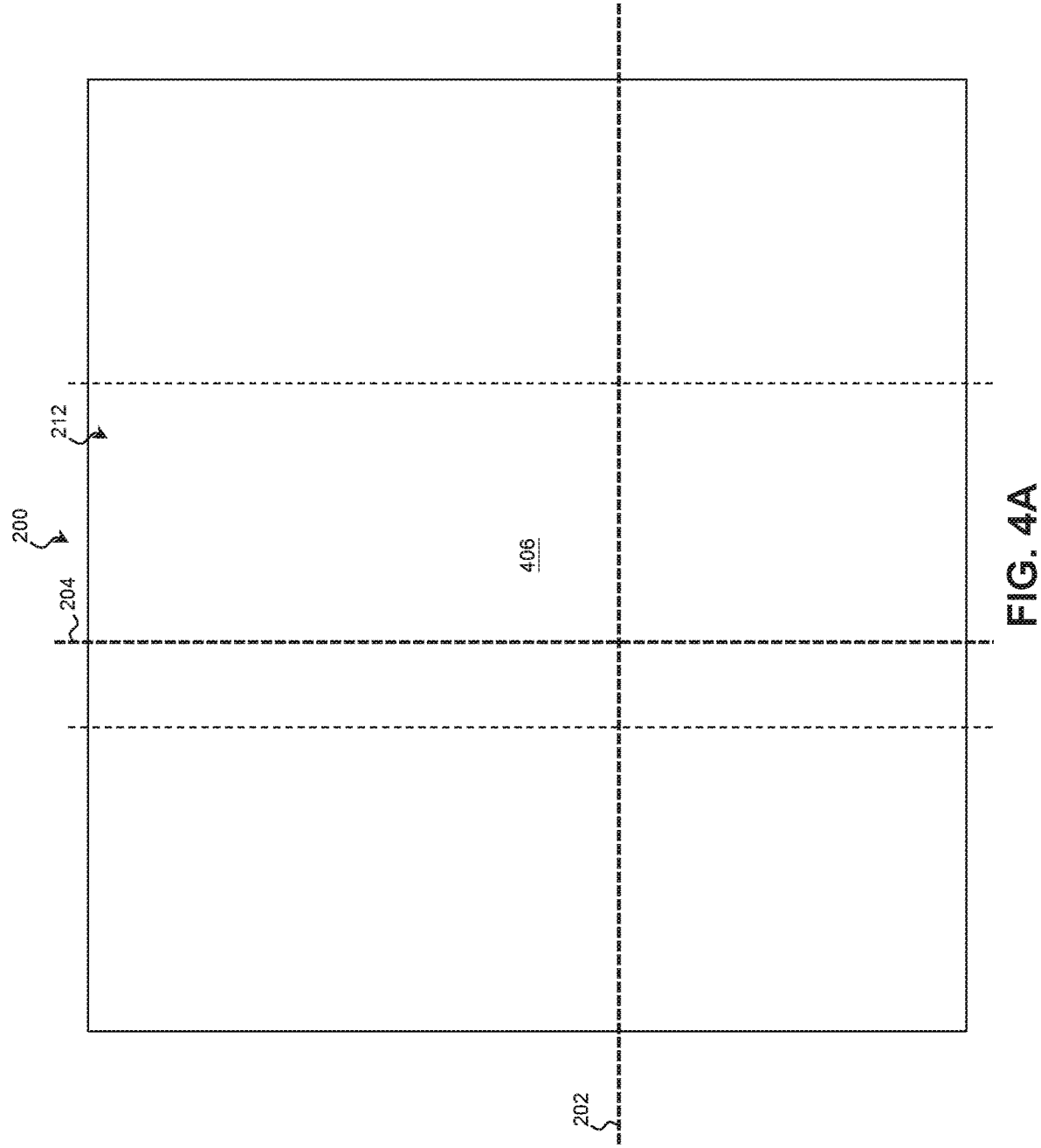

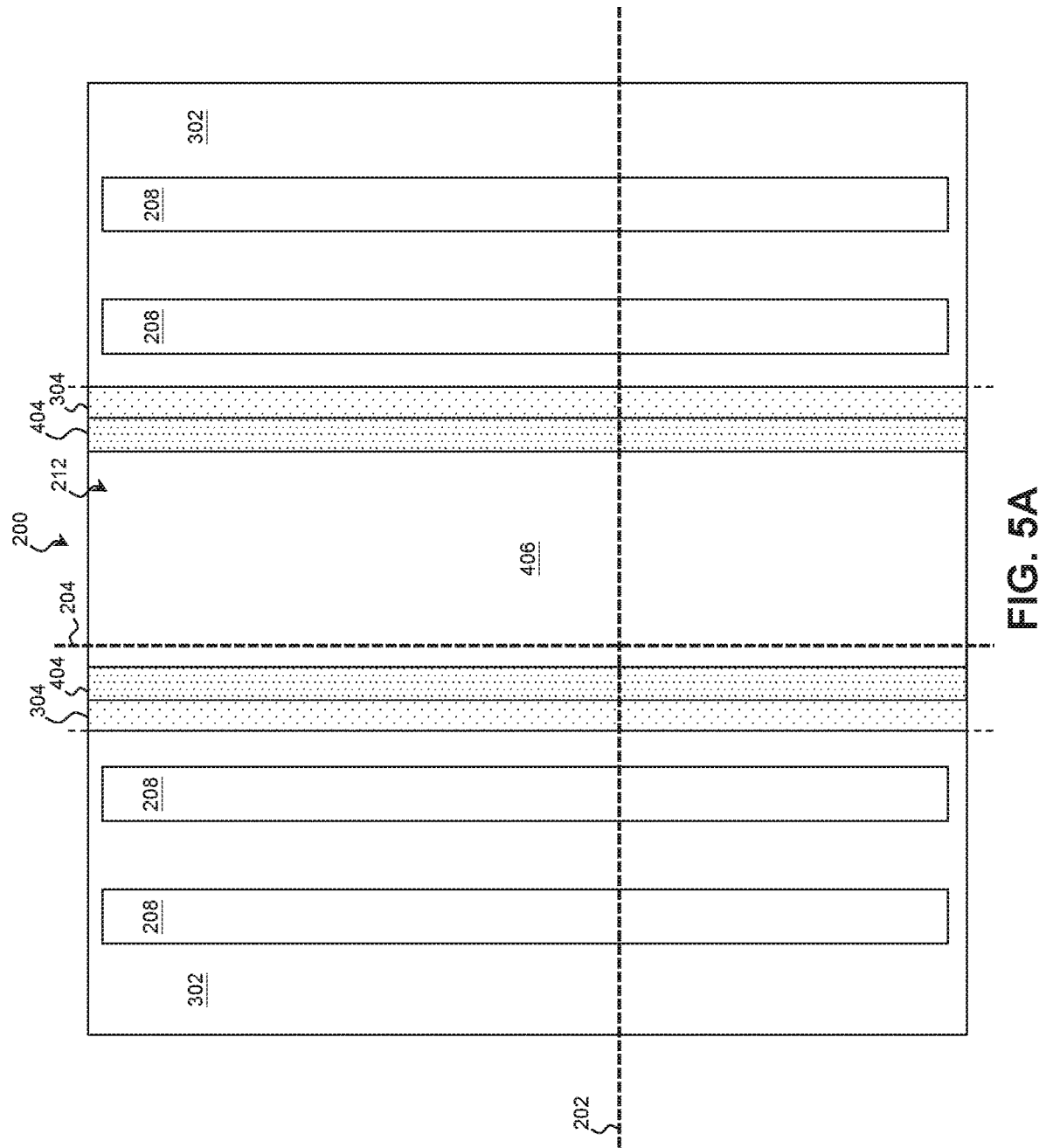

INTEGRATED CIRCUITS WITH CAPACITORS

PRIORITY DATA

The present application is a continuation application of U.S. patent application Ser. No. 17/114,108, filed Dec. 7, 2020, which is a continuation application of U.S. patent application Ser. No. 16/183,113, filed Nov. 7, 2018, which claims the benefit of U.S. Provisional Application No. 62/732,877, entitled "Integrated Circuits with Capacitors," filed Sep. 18, 2018, each of which is herein incorporated by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs. Parallel advances in manufacturing have allowed increasingly complex designs to be fabricated with precision and reliability.

In addition to transistors and other active devices, ICs may include a number of passive devices (e.g., resistors, capacitors, and inductors) distributed among the active devices. Fabrication of the passive devices is as important to the integrity and function of the circuit as the fabrication of the active devices. In fact, fabrication tolerances may be tighter for passive devices because the properties of the passive device being relied upon (e.g., resistance, capacitance, and/or inductance) may depend on the exact size and shape of the features of the passive device. For example, a small change in feature size of a capacitor may have a significant effect on the capacitance. Furthermore, because passive devices have generally resisted efforts to reduce their size, they may occupy a substantial portion of the circuit area. Accordingly, advances in the fabrication of passive devices have the potential to improve yield, reduce variability, reduce circuit area, and provide other benefits.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 3A, 4A, 5A, 6A, 7A, 8A, 9A, 10A, 11A, 12A, and 13 are top view diagrams of the workpiece at various points in the method of fabrication according to various aspects of the present disclosure.

DETAILED DESCRIPTION

Figure 1A:
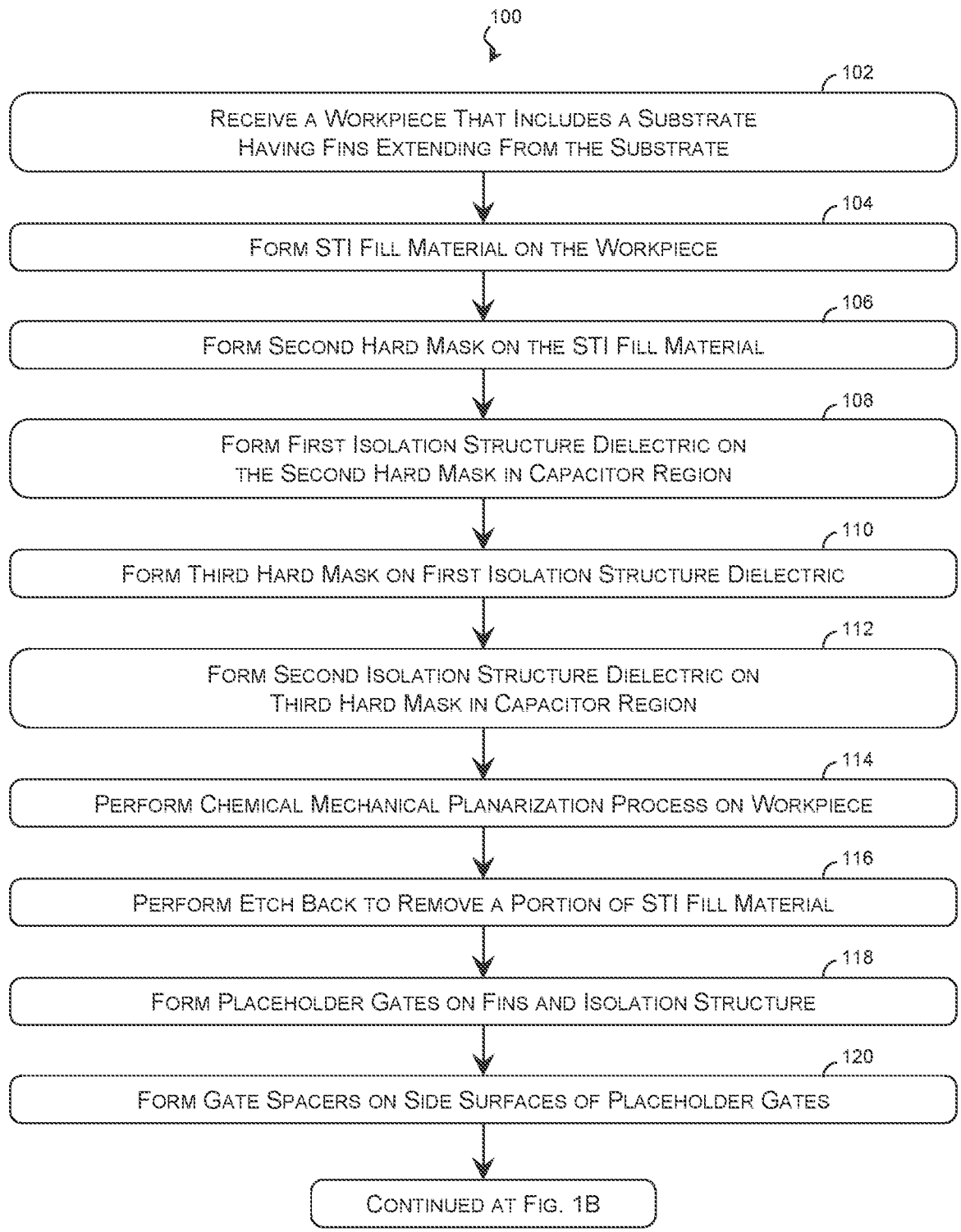
FIGS. 1A and 1B are flow diagrams of a method of fabricating a workpiece with a capacitor structure according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature connected to and/or coupled to another feature in the present disclosure that follows may include embodiments in which the features are formed in direct contact, and may also include embodiments in which additional features may be formed interposing the features, such that the features may not be in direct contact.

In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. In addition, the present disclosure may repeat reference numerals and/or letters in the various examples. This repetition is for the purpose of simplicity and clarity and does not in itself dictate a relationship between the various embodiments and/or configurations beyond the extent noted.

An integrated circuit may include a number of active circuit devices (such as field effect transistors, bipolar junction transistors, etc.) and a number of passive circuit devices (such as resistors, capacitors, inductors, etc.) electrically coupled to one another. As fabrication techniques have evolved, new devices and new designs have become possible. One example is the fin-like field effect transistor (FinFET), a type of three-dimensional transistor where the channel region and source/drain regions are fabricated on a thin "fin" (or fin structure) that extends out of a substrate and the gate wraps around the channel region of the fin. Wrapping the gate around the fin increases the contact area between the channel region and the gate and allows the gate to control the channel from multiple sides. This can be leveraged in a number of way, and in some applications, FinFETs provide reduced short channel effects, reduced leakage, and higher current flow.

However, some fabrication processes that are well-suited for forming active devices, such as FinFETs, adversely impact the passive devices of the circuit. To address this, as described in detail below, some embodiments of the present disclosure provide vertical metal-oxide-metal (VMOM) capacitors and provide a method of fabricating the capacitors alongside FinFETs or other suitable devices. In some such embodiments, the capacitors are formed on an elevated isolation structure that extends above the substrate much like the device fins of the FinFETs. The isolation structure may reduce fluctuations and irregularities in the shape of the capacitor electrodes. As a result, the capacitance of the capacitors formed on the isolation structure is more uniform. Such capacitors may also allow for easier routing and better capacitor density. Of course, these benefits are merely examples and are not required for any particular embodiment.

Figure 1B:
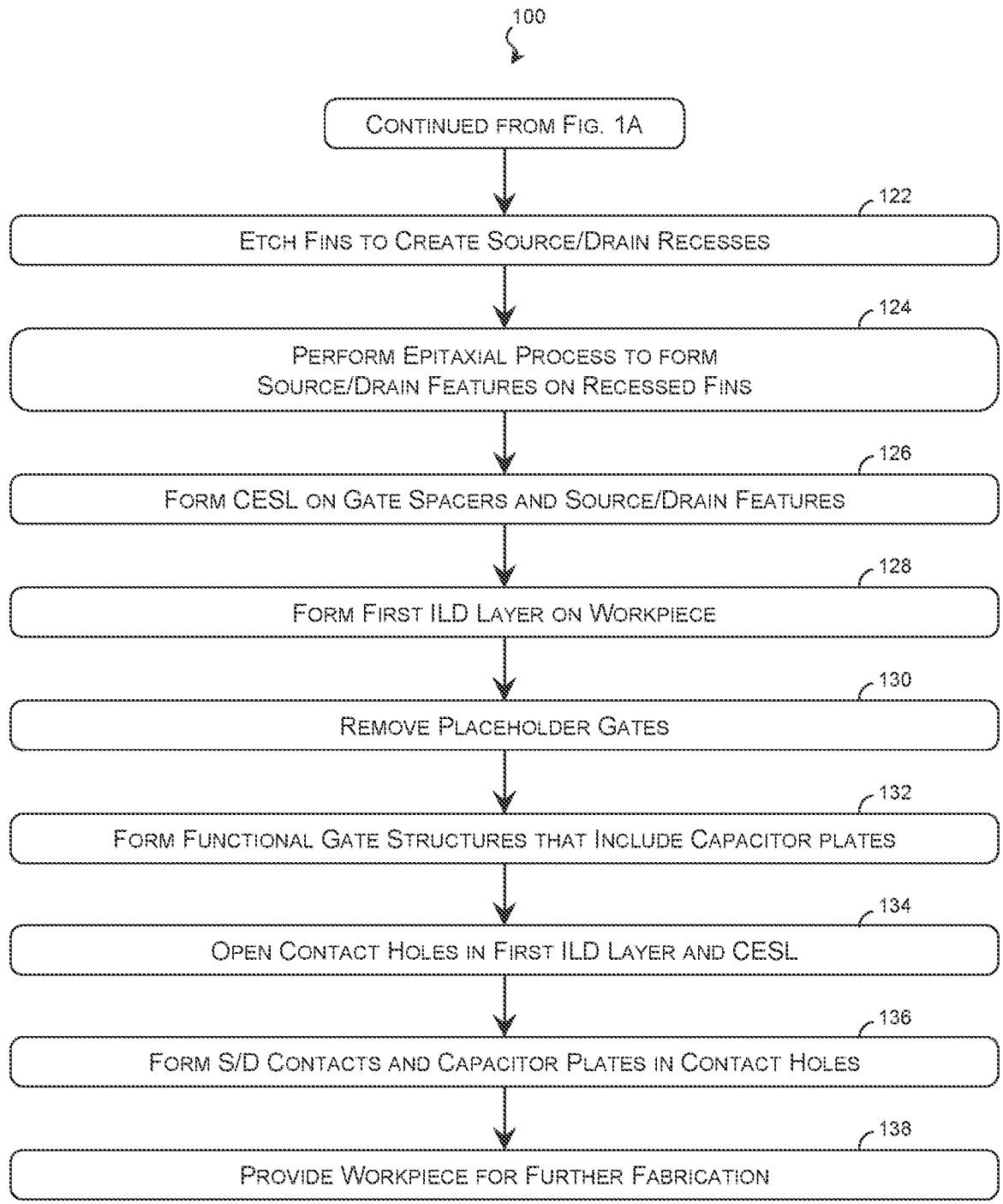

The present disclosure provides examples of an integrated circuit including a capacitor and techniques for forming the circuit. In that regard, FIGS. 1A and 1B are flow diagrams of a method 100 of fabricating a workpiece 200 with a capacitor structure according to various aspects of the present disclosure. Additional steps can be provided before, during, and after the method 100, and some of the steps described can be replaced or eliminated for other embodiments of the method 100.

FIGS. 2A, 3A, 4A, 5A, 6A, 7A, 8A, 9A, 10A, 11A, 12A, and 13 are top view diagrams of the workpiece 200 at various points in the method 100 of fabrication according to various aspects of the present disclosure. FIGS. 2B, 3B, 4B, 5B, 6B, 7B, 8B, 9B, 10B, 11B, and 12B are cross-sectional diagrams of the workpiece 200 taken along a gate plane 202 at various points in the method 100 of fabrication according to various aspects of the present disclosure. FIGS. 7C, 8C, 9C, 10C, 11C, and 12C are cross-sectional diagrams of the workpiece 200 taken along a fin-length plane 204 at various points in the method 100 of fabrication according to various aspects of the present disclosure. FIGS. 2A-13 have been simplified for the sake of clarity and to better illustrate the concepts of the present disclosure. Additional features may be incorporated into the workpiece 200, and some of the features described below may be replaced or eliminated for other embodiments of the workpiece 200.

Figure 2A:
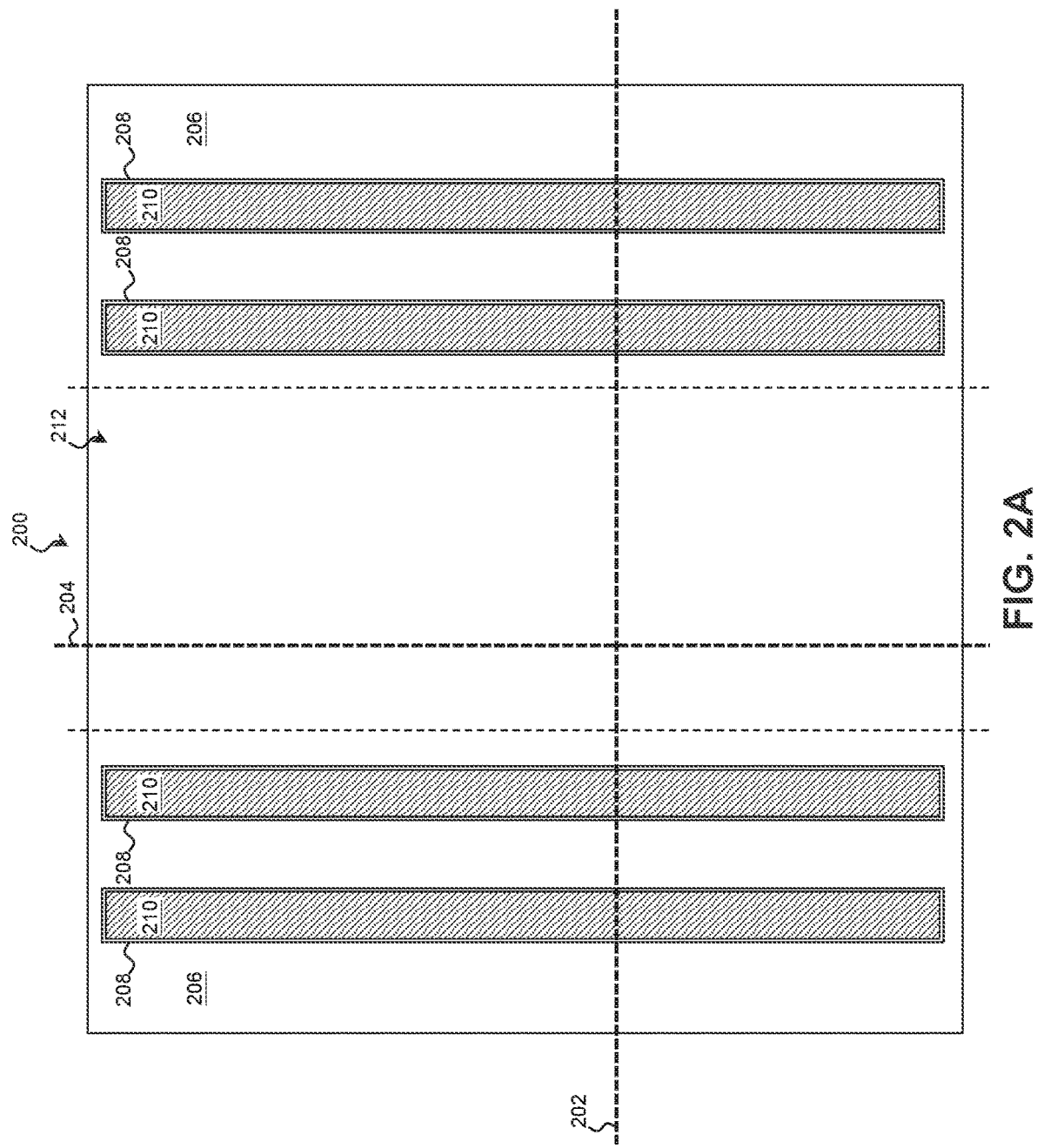
Figure 2B:
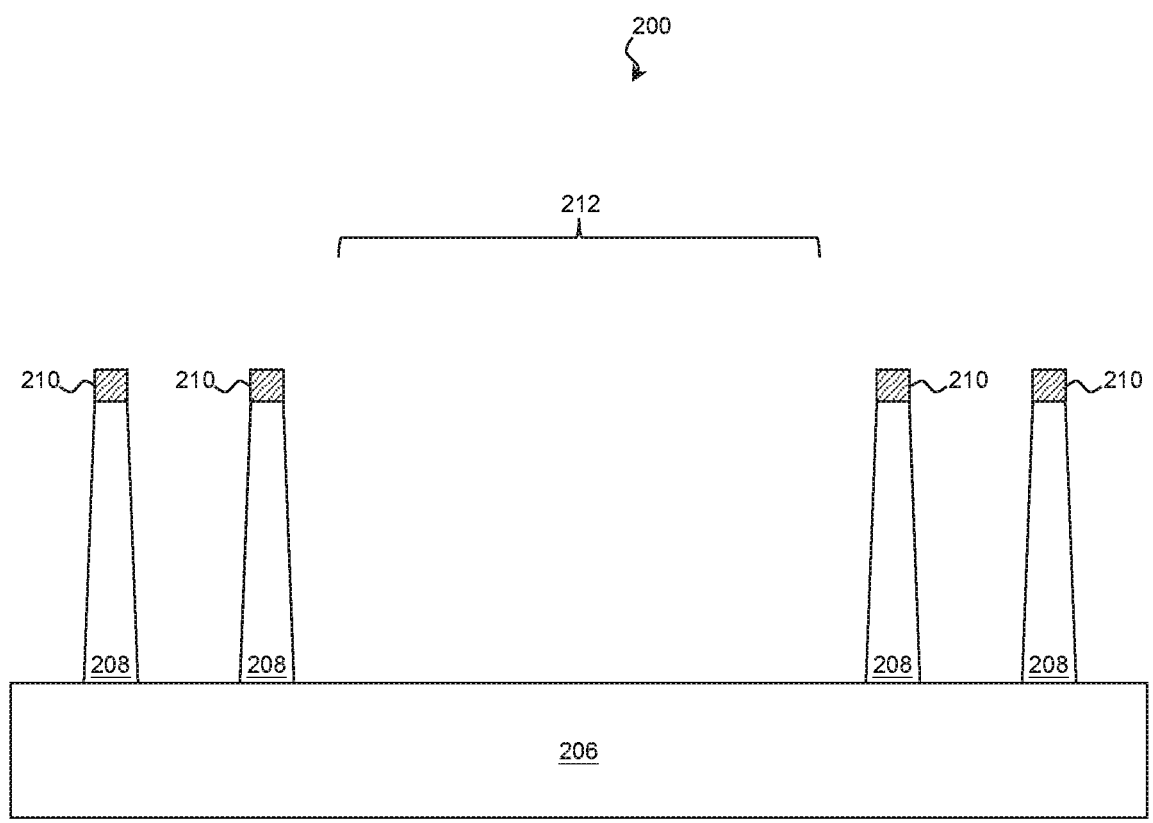
FIGS. 2B, 3B, 4B, 5B, 6B, 7B, 8B, 9B, 10B, 11B, and 12B are cross-sectional diagrams of the workpiece taken along a gate plane at various points in the method of fabrication according to various aspects of the present disclosure.

Referring to block 102 of FIG. 1A and to FIGS. 2A-2C, the workpiece 200 is received. The workpiece 200 includes a substrate 206 upon which devices are to be formed. In various examples, the substrate 206 includes an elementary (single element) semiconductor, such as silicon or germanium in a crystalline structure; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; a non-semiconductor material, such as soda-lime glass, fused silica, fused quartz, and/or calcium fluoride ($CaF_2$); and/or combinations thereof.

The substrate 206 may be uniform in composition or may include various layers, some of which may be selectively etched to form the fins. The layers may have similar or different compositions, and in various embodiments, some substrate layers have non-uniform compositions to induce device strain and thereby tune device performance. Examples of layered substrates include silicon-on-insulator (SOI) substrates 206. In some such examples, a layer of the substrate 206 may include an insulator such as a semiconductor oxide, a semiconductor nitride, a semiconductor oxynitride, a semiconductor carbide, and/or other suitable insulator materials.

Doped regions, such as wells, may be formed on the substrate 206. In that regard, some portions of the substrate 206 may be doped with p-type dopants, such as boron, $BF_2$, or indium while other portions of the substrate 206 may be doped with n-type dopants, such as phosphorus or arsenic; and/or other suitable dopants including combinations thereof.

In some examples, the devices to be formed on the substrate 206 extend out of the substrate 206. For example, FinFETs and/or other non-planar devices may be formed on device fins 208 disposed on the substrate 206. The device fins 208 are representative of any raised feature and include FinFET device fins 208 as well as fins 208 for forming other raised active and passive devices upon the substrate 206. The fins 208 may be similar in composition to the substrate 206 or may be different therefrom. For example, in some embodiments, the substrate 206 may include primarily silicon, while the fins 208 include one or more layers that are primarily germanium or a SiGe semiconductor. In some embodiments, the substrate 206 includes a SiGe semiconductor, and the fins 208 include one or more layers that include a SiGe semiconductor with a different ratio of silicon to germanium.

The fins 208 may be formed by etching portions of the substrate 206, by depositing various layers on the substrate 206 and etching the layers, and/or by other suitable techniques. For example, the fins 208 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the substrate 206 and patterned using a photolithography process. Spacers (e.g., first hard mask layer 210) are formed alongside the patterned sacrificial layer using a self-aligned process. The sacrificial layer is then removed, and the remaining spacers may then be used to pattern the fins.

The patterning process may leave a capacitor region 212 of the workpiece 200 free of device fins 208 to reserve area for an isolation structure and capacitors to be formed.

Figure 3A:
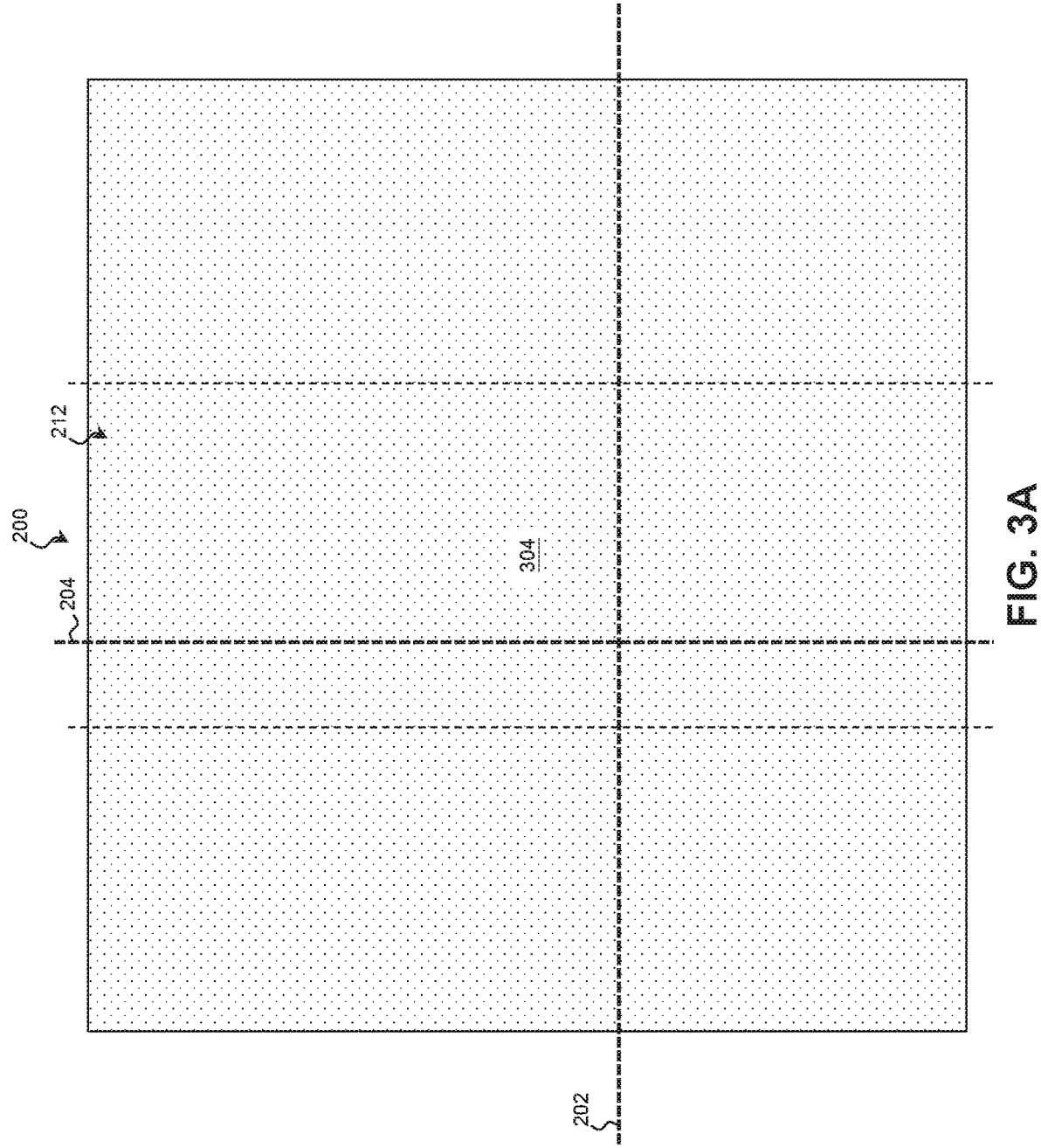
Figure 3B:
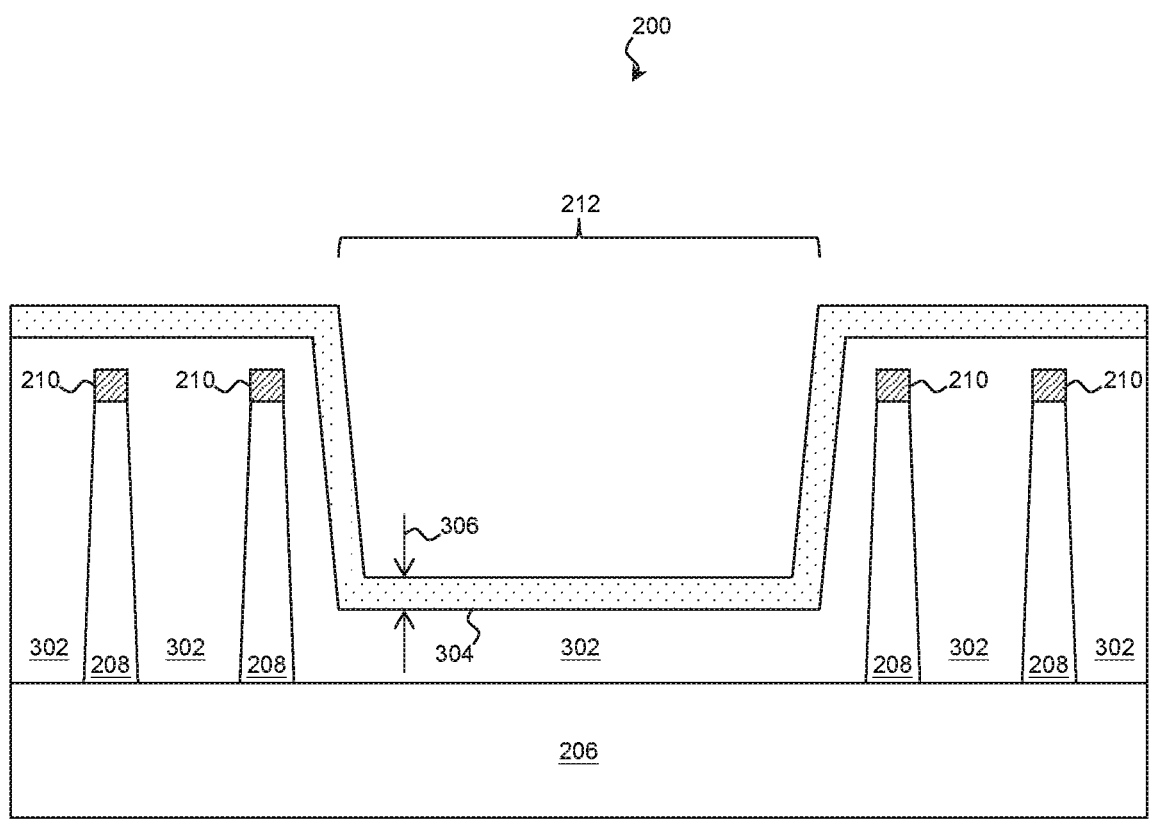

Referring to block 104 of FIG. 1A and to FIGS. 3A-3B, a Shallow-Trench Isolation (STI) fill material 302 is deposited on the workpiece 200. The STI fill material 302 may include a dielectric material such as a semiconductor oxide, a semiconductor nitride, a semiconductor carbide, Fluoro-Silicate Glass (FSG), a low-K dielectric material, and/or other suitable dielectric material.

The STI fill material 302 may be formed using any suitable process including Chemical Vapor Deposition (CVD), High-Density Plasma CVD (HDP-CVD), Physical Vapor Deposition (PVD), spin-on deposition, and/or other suitable deposition processes. The STI fill material 302 may be formed to any suitable thickness and may be formed thick enough to fill the gap between device fins 208. In examples where the STI fill material 302 is deposited by a generally conformal process (e.g., CVD or similar), the top surface of the STI fill material 302 over the fins 208 may extend above the top surface of the STI fill material 302 in the capacitor region 212. In contrast, in examples where the STI fill material 302 is deposited in a less-conformal process (e.g., spin-on deposition), the portion of the STI fill material 302 within the capacitor region 212 may be recessed by masking off the STI fill material 302 outside of the capacitor region 212 and performing an etching process on the exposed STI fill material 302 in the capacitor region 212. In both types of examples, the top surface of the STI fill material 302 over the fins extends above the top surface of the STI fill material 302 in the capacitor region 212 at the conclusion of block 104.

Referring to block 106 of FIG. 1A and referring still to FIGS. 3A-3B, a second hard mask 304 is formed on the STI fill material 302. In some examples, the second hard mask 304 is deposited as a substantially conformal layer that includes a horizontal portion in the capacitor region 212 and side portions that slope upwards from the horizontal portion located at the ends of the capacitor region 212. In some such examples, the slope of the side portions approach vertical.

The second hard mask 304 may include a dielectric material such as a semiconductor oxide, a semiconductor nitride, and/or a semiconductor carbide, and may be selected to have a different composition and etchant sensitivity than the STI fill material 302. In some such examples, the STI fill material 302 includes silicon oxide, and the second hard mask 304 includes silicon nitride and/or silicon carbide. The second hard mask 304 may be formed using any suitable process including CVD, HDP-CVD, PVD, Atomic Layer Deposition (ALD), and/or other suitable deposition processes, and may be formed to any suitable thickness. In various such examples, the second hard mask 304 has a thickness between about 10 nm and about 20 nm as indicated by marker 306.

Figure 4B:
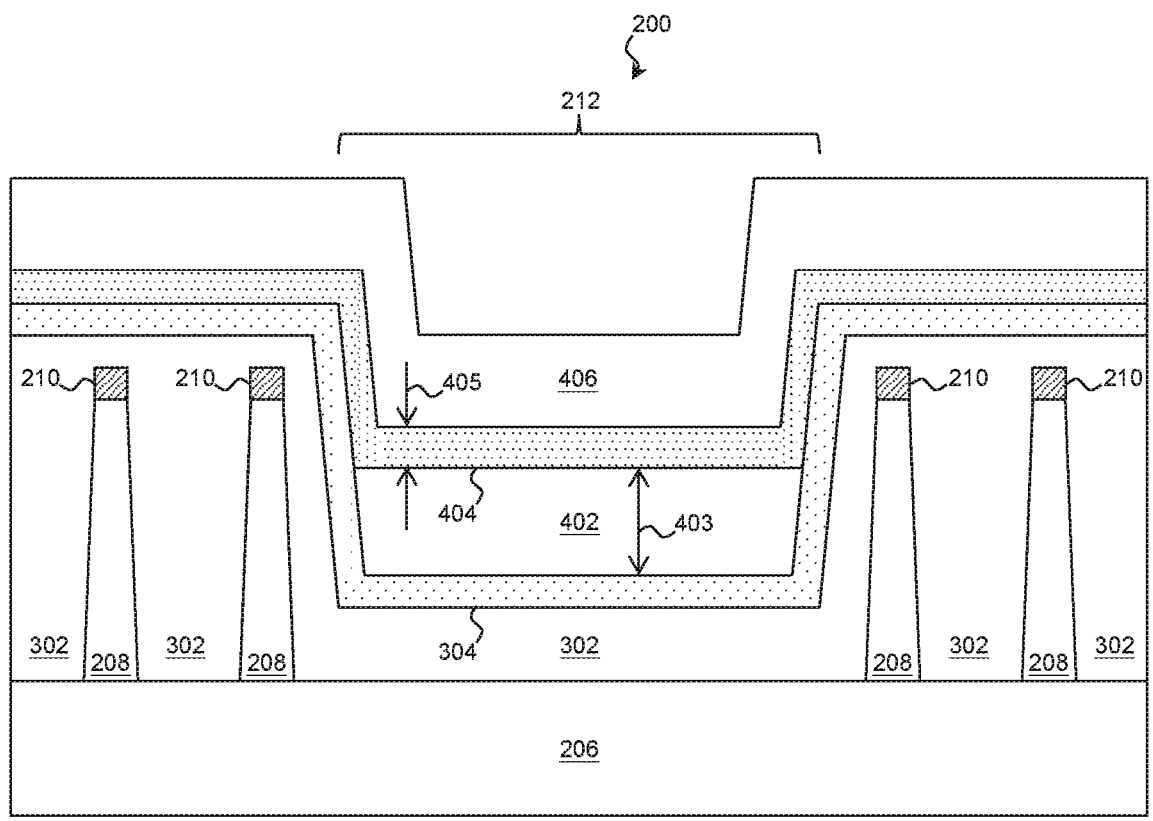

Referring to block 108 of FIG. 1A and to FIGS. 4A-4B, a first isolation structure dielectric 402 is deposited on the second hard mask 304. Within the capacitor region 212, the first isolation structure dielectric 402 may be disposed on and physically contact the horizontal portion of the second hard mask 304 and at least a portion of the side portions of the second hard mask 304. In some examples, the first isolation structure dielectric 402 is deposited thick enough to fill a trench defined by the horizontal and side portions of the second hard mask 304. The first isolation structure dielectric 402 may then be etched back so that the remainder of the dielectric 402 fills only a portion of the trench and at least some of the side portions of the second hard mask 304 are exposed as illustrated in FIGS. 4A and 4B. The etching back of the first isolation structure 402 may also remove portions of the first isolation structure 402 deposited outside of the capacitor region 212. In various examples, the first isolation structure dielectric 402 has a thickness between about 30 nm and about 40 nm as indicated by marker 403 at the conclusion of block 108.

The first isolation structure dielectric 402 may be formed using any suitable process including CVD, HDP-CVD, PVD, ALD, spin-on deposition, and/or other suitable deposition processes, and may be formed to any suitable thickness. The first isolation structure dielectric 402 may include a dielectric material such as a semiconductor oxide, a semiconductor nitride, a semiconductor carbide, FluoroSilicate Glass (FSG), a low-K dielectric material, and/or other suitable dielectric material. The first isolation structure dielectric 402 may have a similar composition to the STI fill material 302, and in an example, both the first isolation structure dielectric 402 and the STI fill material 302 include silicon oxide.

Referring to block 110 of FIG. 1A and referring still to FIGS. 4A-4B, a third hard mask 404 is formed on the first isolation structure dielectric 402 in the capacitor region 212. In particular, the third hard mask 404 may be disposed on and physically contact a top surface of the first isolation structure dielectric 402. As the first isolation dielectric 402 may not completely fill the trench defined by the second hard mask 304, the third hard mask 404 may extend along and physically contact the upper portions of the side portions of the second hard mask 304. Accordingly, in such examples, the third hard mask 404 may be formed as a substantially conformal layer that includes a horizontal portion that physically contacts the first isolation dielectric 402 and side portions that slope upwards from the horizontal portions and that physically contact the second hard mask 304.

The third hard mask 404 may include a dielectric material such as a semiconductor oxide, a semiconductor nitride, and/or a semiconductor carbide. The third hard mask 404 may be selected to have a different composition and etchant sensitivity than the STI fill material 302 and may have the same or different composition than the second hard mask 304. In some such examples, the STI fill material 302 includes silicon oxide, and third hard mask 404 and the second hard mask 304 each include silicon nitride and/or silicon carbide. The third hard mask 404 may be formed using any suitable process including CVD, HDP-CVD, PVD, ALD, and/or other suitable deposition processes, and may be formed to any suitable thickness. In various such examples, the third hard mask 404 has a thickness between about 10 nm and about 20 nm as indicated by marker 405. Accordingly, the second hard mask 304, the first isolation structure dielectric 402, and the third hard mask 404 form an isolation structure that extends, in some examples, between about 50 nm and about 80 nm above the STI fill material 302.

Referring to block 112 of FIG. 1A and referring still to FIGS. 4A-4B, a second isolation structure dielectric 406 is deposited on the third hard mask 404.

Within the capacitor region 212, the second isolation structure dielectric 406 may be disposed on and physically contact the horizontal and side portions of the third hard mask 404. In some examples, the second isolation structure dielectric 406 is deposited outside of the capacitor region as well.

The second isolation structure dielectric 406 may be formed using any suitable process including CVD, HDP-CVD, PVD, ALD, spin-on deposition, and/or other suitable deposition processes, and may be formed to any suitable thickness. The second isolation structure dielectric 406 may include a dielectric material such as a semiconductor oxide, a semiconductor nitride, a semiconductor carbide, Fluoro-Silicate Glass (FSG), a low-K dielectric material, and/or other suitable dielectric material. The second isolation structure dielectric 406 may have a similar composition to the STI fill material and/or the first isolation structure dielectric 402, and in an example, the STI fill material 302, the first isolation structure dielectric 402, and the second isolation structure dielectric 406 each include silicon oxide.

Figure 5B:
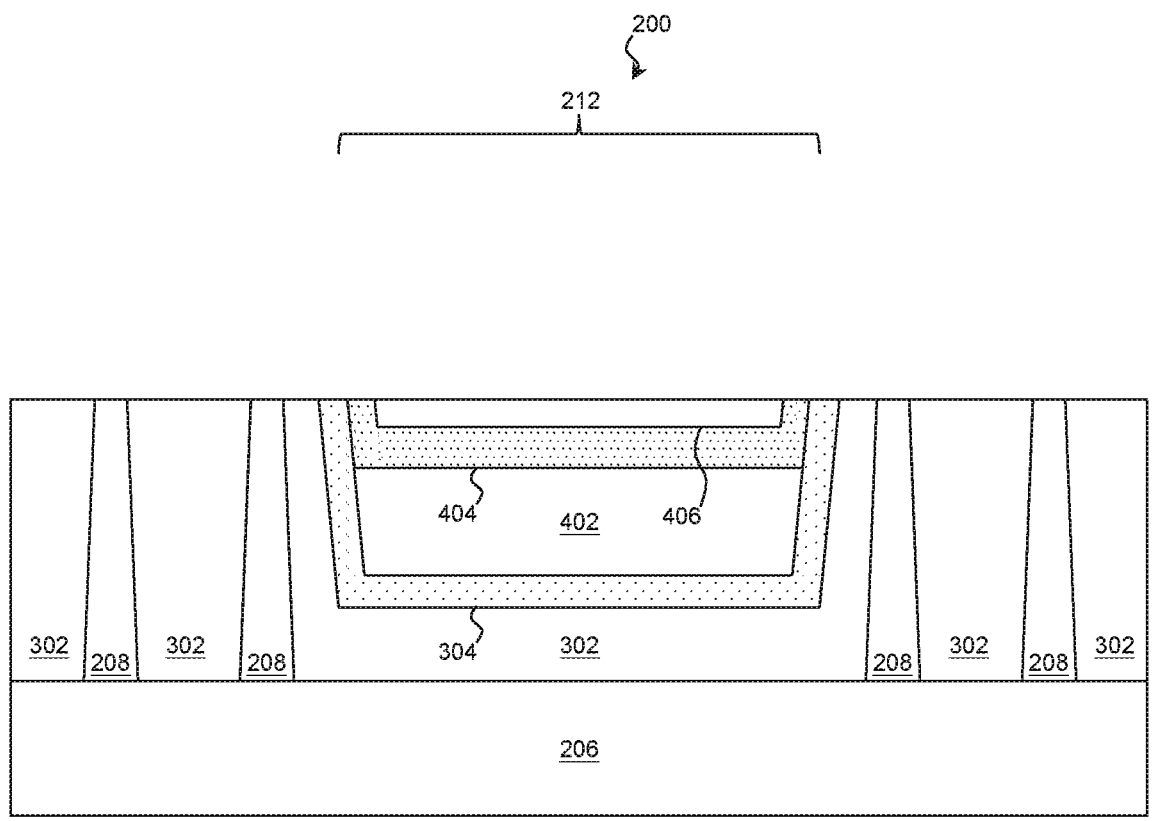

Referring to block 114 of FIG. 1A and to FIGS. 5A-5B, a Chemical Mechanical Planarization/Polish (CMP) process is performed on the workpiece 200. The CMP process may remove any overlying material from the fins 208 (e.g., the STI fill material 302, the first hard mask layer 210, the second hard mask 304, the third hard mask 404, the second isolation structure dielectric 406, etc.) to expose the top of the fins 208 themselves. Accordingly, the CMP process of block 114 produces a substantially coplanar top surface that includes top surfaces of the fins 208, the STI fill material 302, the second hard mask 304, the third hard mask 404, and the second isolation structure dielectric 406.

Figure 6A:
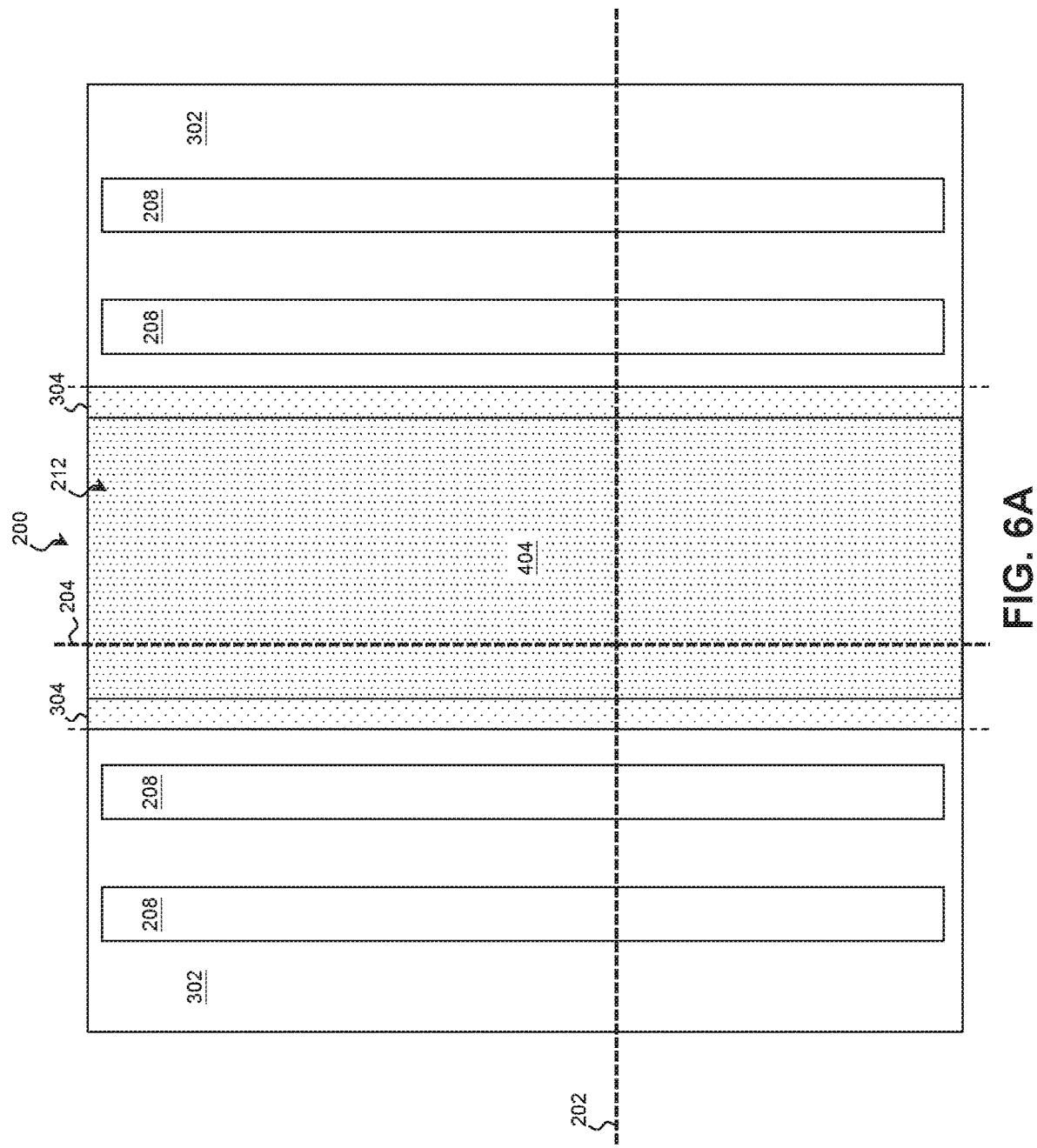
Figure 6B:
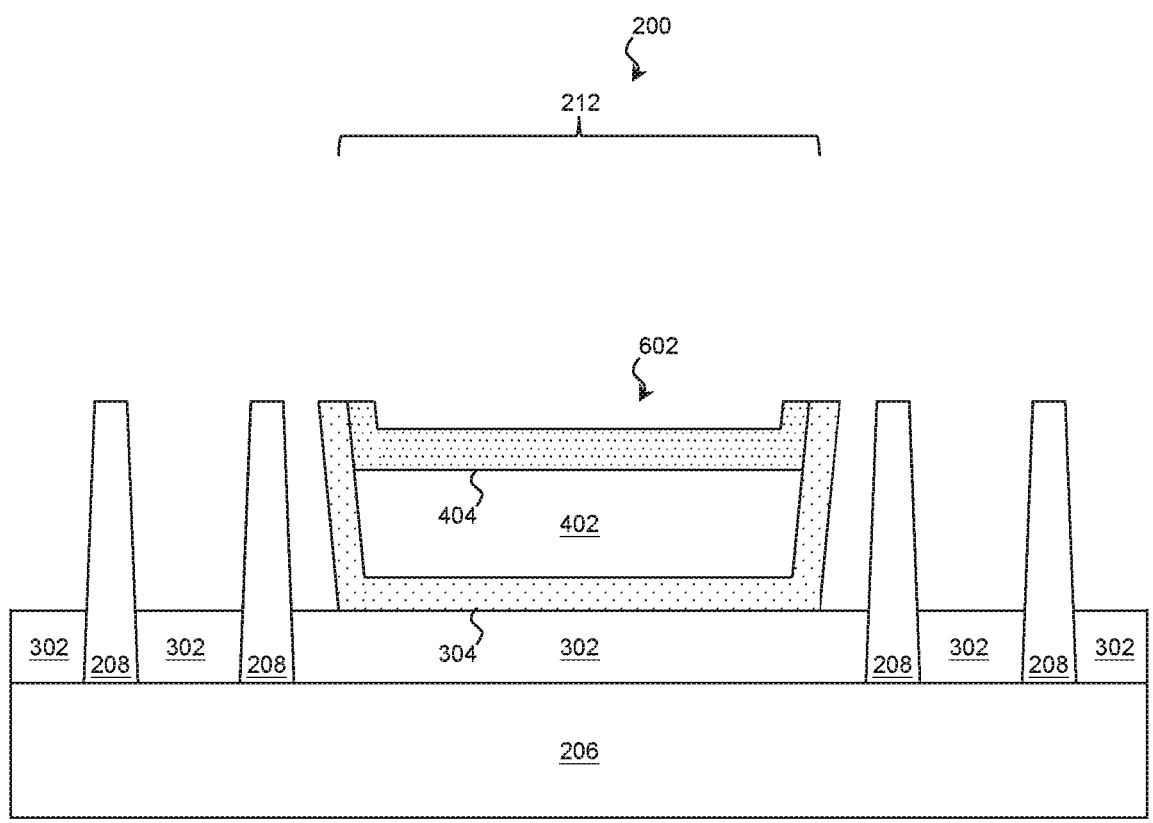

Referring to block 116 of FIG. 1A and to FIGS. 6A-6B, an etch-back process is performed on the workpiece 200 to remove a portion of the STI fill material 302. The etch-back process may include any suitable etching technique, such as wet etching, dry etching, Reactive Ion Etching (RIE), ashing, and/or other etching methods. In some embodiments, the etching process includes dry etching using a fluorine-based etchant, an oxygen-based etchant, a chlorine-based etchant, a bromine-based etchant, an iodine-based etchant, other suitable etchant gases or plasmas, and/or combinations thereof. In particular, the etching steps and chemistries may be configured to etch the STI fill material 302 without significantly etching the fins 208, the second hard mask 304, or the third hard mask 404. In some examples, the etch-back process also removes the second isolation structure dielectric 406 from the third hard mask 404 within the capacitor region 212.

As can be seen in FIG. 6B, the second hard mask 304, the first isolation structure dielectric 402 and the third hard mask 404 define a raised structure (i.e., an isolation structure 602) within the capacitor region 212. As explained below, by forming capacitors on the isolation structure 602, the feature dimensions may be more carefully controlled than if, for example, the capacitors are formed directly on the STI fill material 302.

Figure 7A:
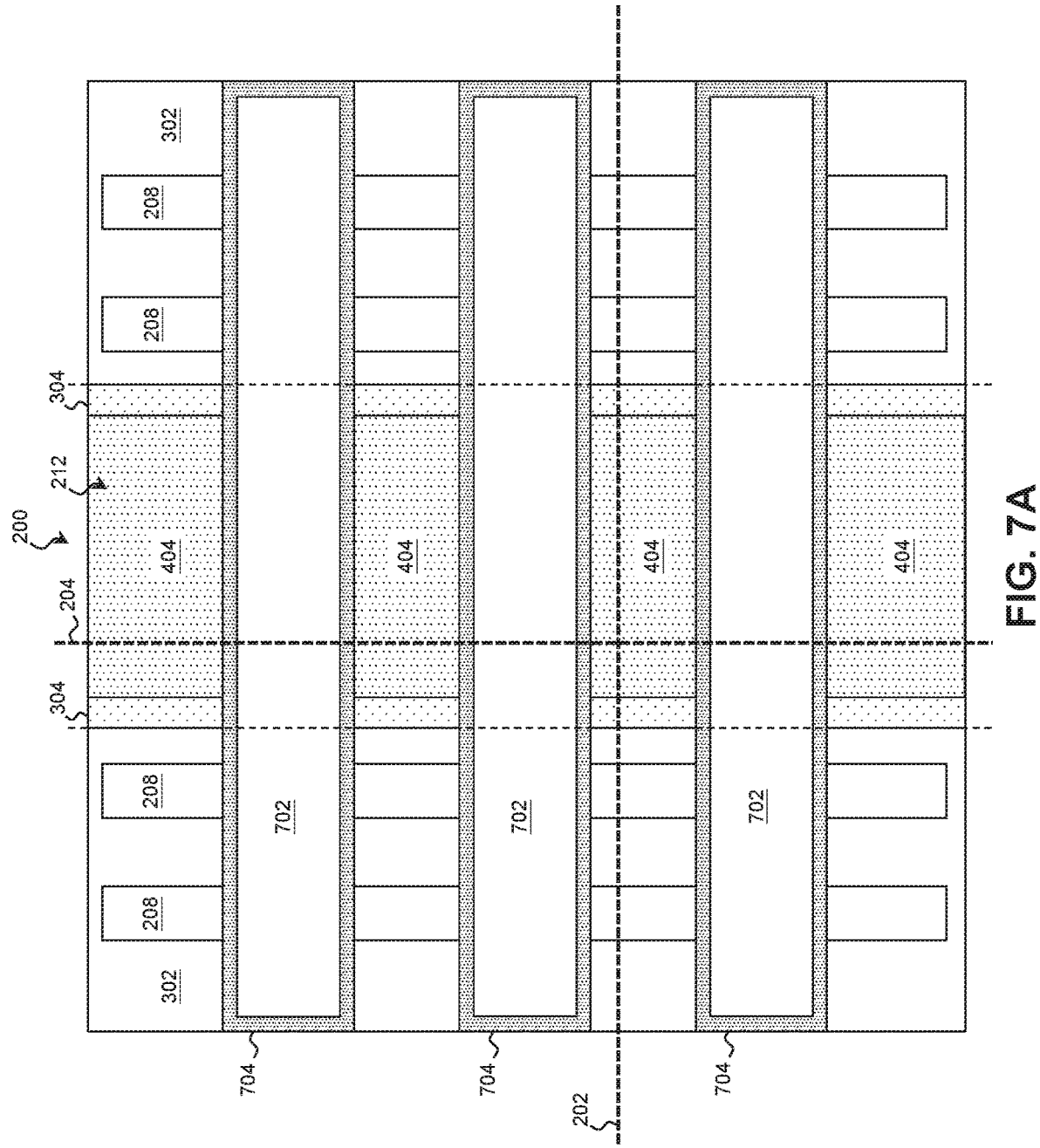
Figure 7B:
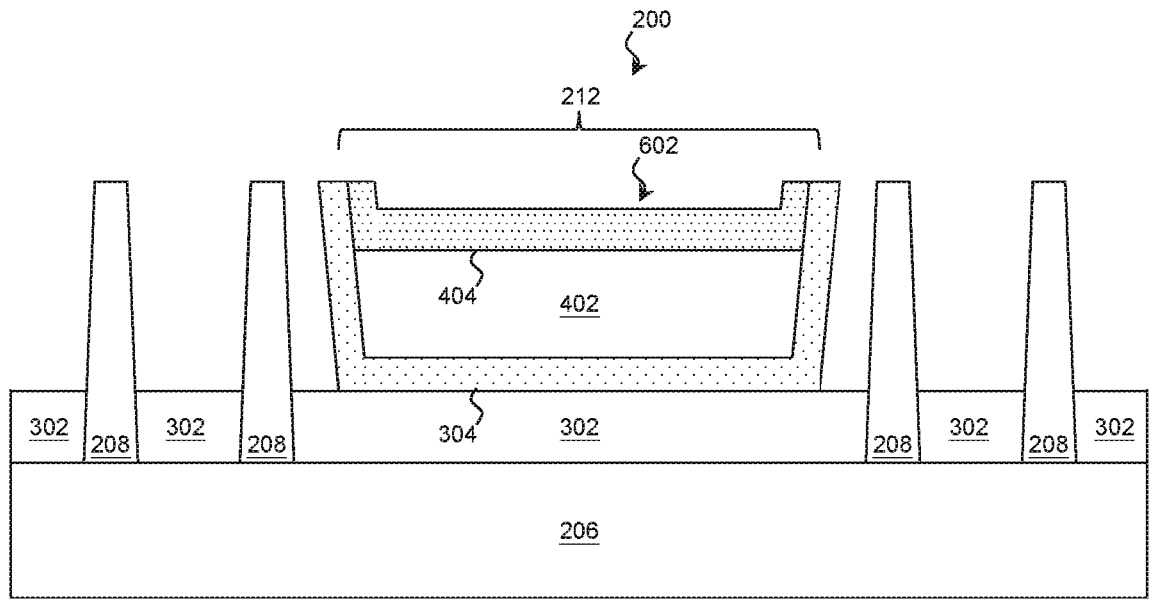
Figure 7C:
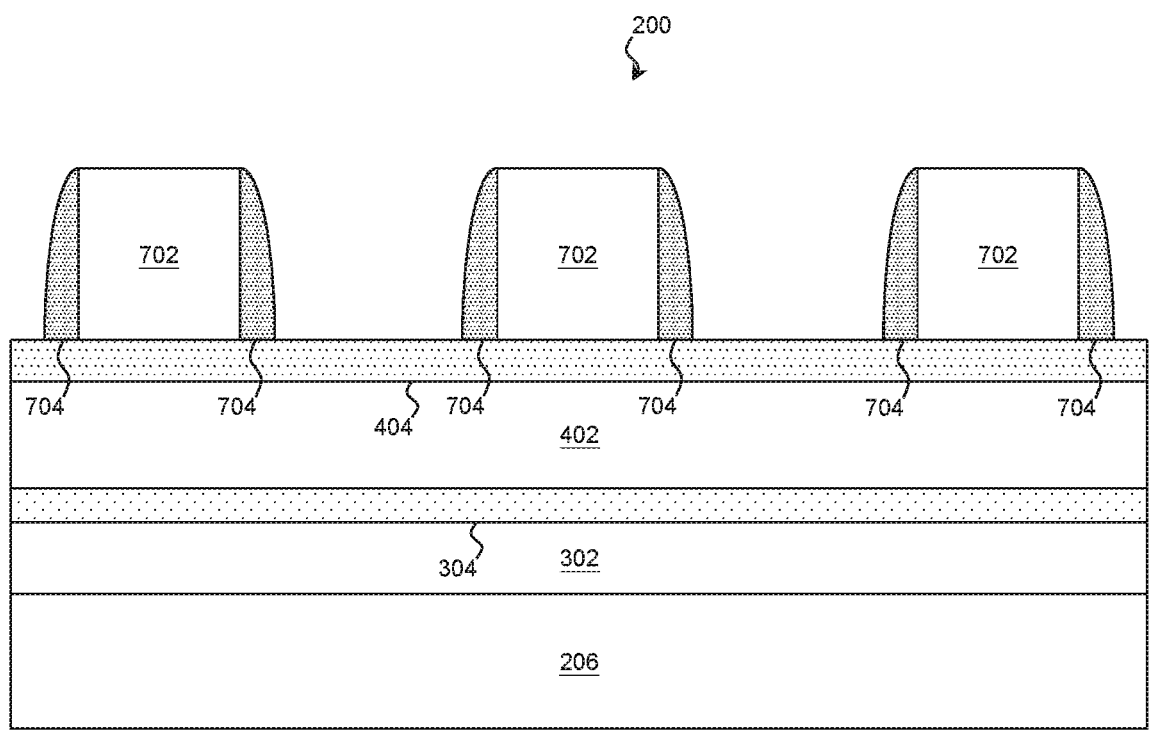
FIGS. 7C, 8C, 9C, 10C, 11C, and 12C are cross-sectional diagrams of the workpiece taken along a fin-length plane at various points in the method of fabrication according to various aspects of the present disclosure.

Referring to block 118 of FIG. 1A and to FIGS. 7A-7C, placeholder or dummy gates 702 are formed over channel regions of the fins 208. Because the gate fabrication process may be used to form some of the electrodes of the capacitors in the capacitor region 212, the placeholder gates 702 may be formed over the isolation structure 602 in the capacitor region 212 as well. In an example, forming the placeholder gates 702 includes depositing a layer of placeholder gate material such as polysilicon, a dielectric material (e.g., a semiconductor oxide, a semiconductor nitride, a semiconductor oxynitride, a semiconductor carbide, a semiconductor oxycarbonitride, etc.), and/or other suitable material. In various examples, the placeholder gate material is formed to any suitable thickness using any suitable process including CVD, HDP-CVD, PVD, ALD, spin-on deposition, and/or other suitable deposition processes. The placeholder gate material may be deposited as a uniform layer and patterned in a photolithographic process.

In some such examples, a photoresist layer is formed on the placeholder gate material and patterned to define the placeholder gates 702. An exemplary photoresist layer includes a photosensitive material that causes the layer to undergo a property change when exposed to light. This property change can be used to selectively remove exposed or unexposed portions of the photoresist layer in a process referred to as lithographic patterning. In an example, a photolithographic system exposes the photoresist layer to radiation in a particular pattern determined by a mask. Light passing through or reflecting off the mask strikes the photoresist layer, thereby transferring a pattern formed on the mask to the photoresist layer. In other such examples, the photoresist layer is patterned using a direct write or maskless lithographic technique, such as laser patterning, e-beam patterning, and/or ion-beam patterning.

Once exposed, the photoresist layer is developed, leaving the exposed portions of the resist, or in alternative examples, leaving the unexposed portions of the resist. An exemplary patterning process includes soft baking of the photoresist layer, mask aligning, exposure, post-exposure baking, developing the photoresist layer, rinsing, and drying (e.g., hard baking). The patterned photoresist layer exposes portions of the placeholder gate material to be etched.

The portions of the placeholder gate material exposed by the photoresist layer are etched to further define the placeholder gates 702. The etching processes may include any suitable etching technique, such as wet etching, dry etching, RIE, ashing, and/or other etching methods. In some embodiments, the etching process includes dry etching using an oxygen-based etchant, a fluorine-based etchant, a chlorine-based etchant, a bromine-based etchant, an iodine-based etchant, other suitable etchant gases or plasmas, and/or combinations thereof. In particular, the etching steps and chemistries may be configured to etch the placeholder gate material without significantly etching the surrounding materials. Any remaining photoresist layer may be removed from the placeholder gate material after the etching.

Referring to block 120 of FIG. 1A and referring still to FIGS. 7A-7C, gate spacers 704 are formed on side surfaces of the placeholder gates 702. In various examples, the gate spacers 704 include one or more layers of suitable materials, such as a dielectric material (e.g., a semiconductor oxide, a semiconductor nitride, a semiconductor oxynitride, a semiconductor carbide, a semiconductor oxycarbonitride, etc.), SOG, tetraethylorthosilicate (TEOS), PE-oxide, HARP-formed oxide, and/or other suitable material. The subset of the gate spacers 704 formed in the capacitor region 212 may be part of a dielectric of the resulting capacitors, and the material(s) of the gate spacers 704 may be selected based on part on their dielectric constants. In one such example, the gate spacers 704 each include a first layer of silicon oxide, a second layer of silicon nitride disposed on the first layer, and a third layer of silicon oxide disposed on the second layer.

Furthermore, because the gate spacers 704 may make up part of the capacitor dielectric, the thickness of the gate spacers 704 may affect the dielectric thickness (i.e., the plate gap) of the resulting capacitors, and the thickness may be selected accordingly. In various examples, the gate spacers 704 have a thickness between about 5 nm and about 10 nm.

The gate spacers 704 may be formed using any suitable deposition technique (e.g., CVD, HDP-CVD, ALD, etc.). In an example, the gate spacers 704 are deposited on the placeholder gates 702, the fins 208, the STI fill material 302, the second hard mask 304 and the third hard mask 404 using a conformal technique. The gate spacer 704 layers are then etched using a directional etching technique to remove the gate spacers 704 from the horizontal surfaces while leaving them on the vertical surfaces of the placeholder gates 702. This defines the gate spacers 704 alongside the placeholder gates 702. The etching process may be performed using any suitable etching method, such as anisotropic wet etching, dry etching, RIE, ashing, and/or other etching methods and may use any suitable etchant chemistries. The etching methods and the etchant chemistries may vary as the gate spacer 704 layers are etched to target the particular material being etched while minimizing unintended etching of the materials not being targeted.

Figure 8A:
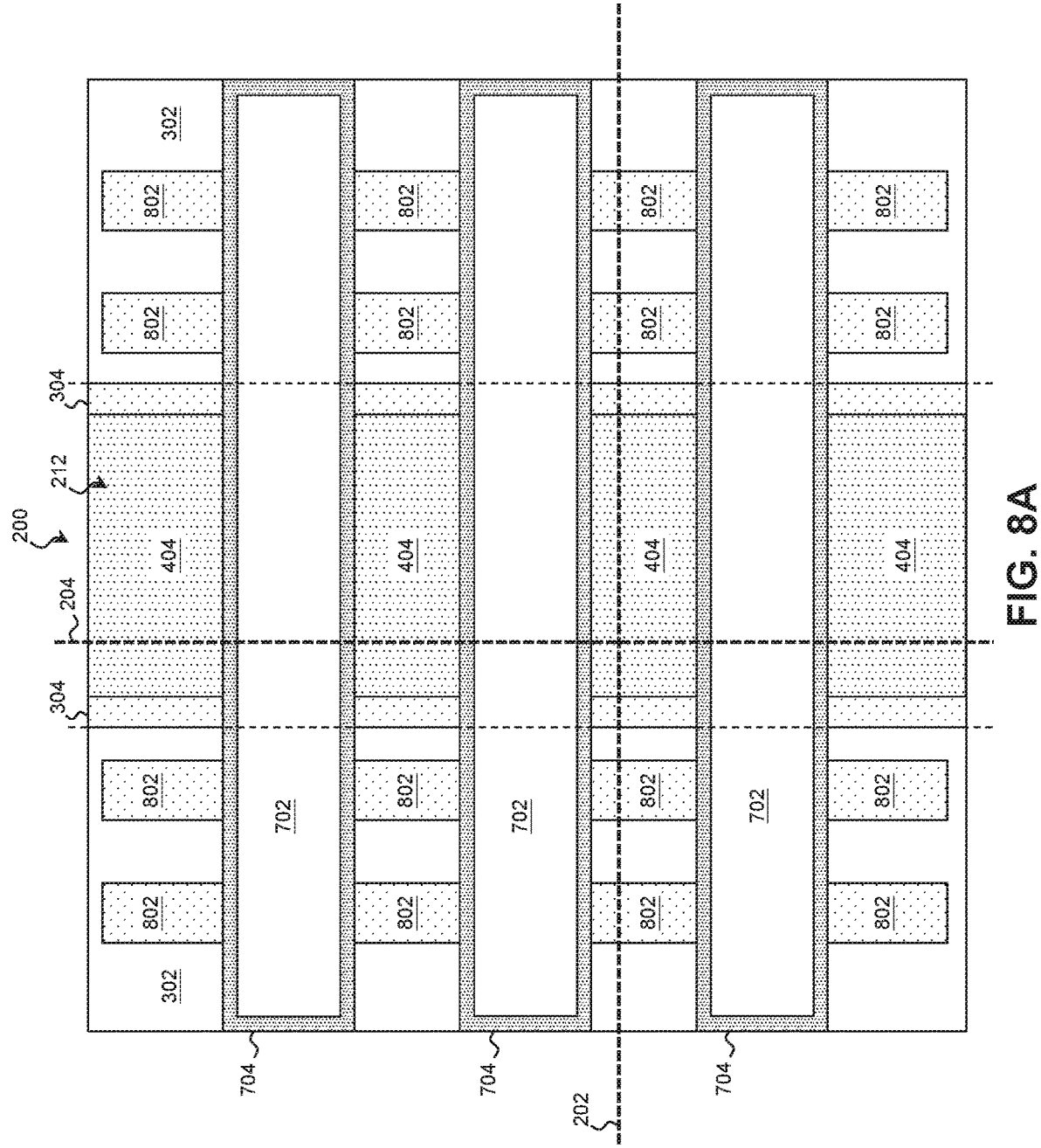
Figure 8B:
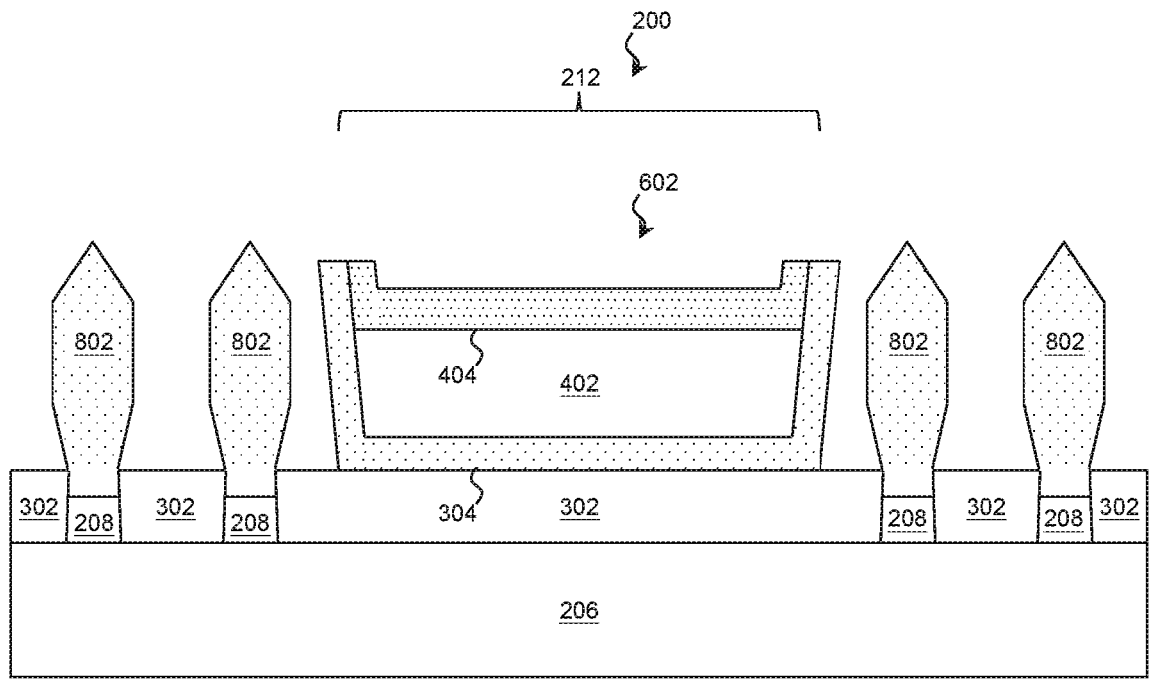
Figure 8C:
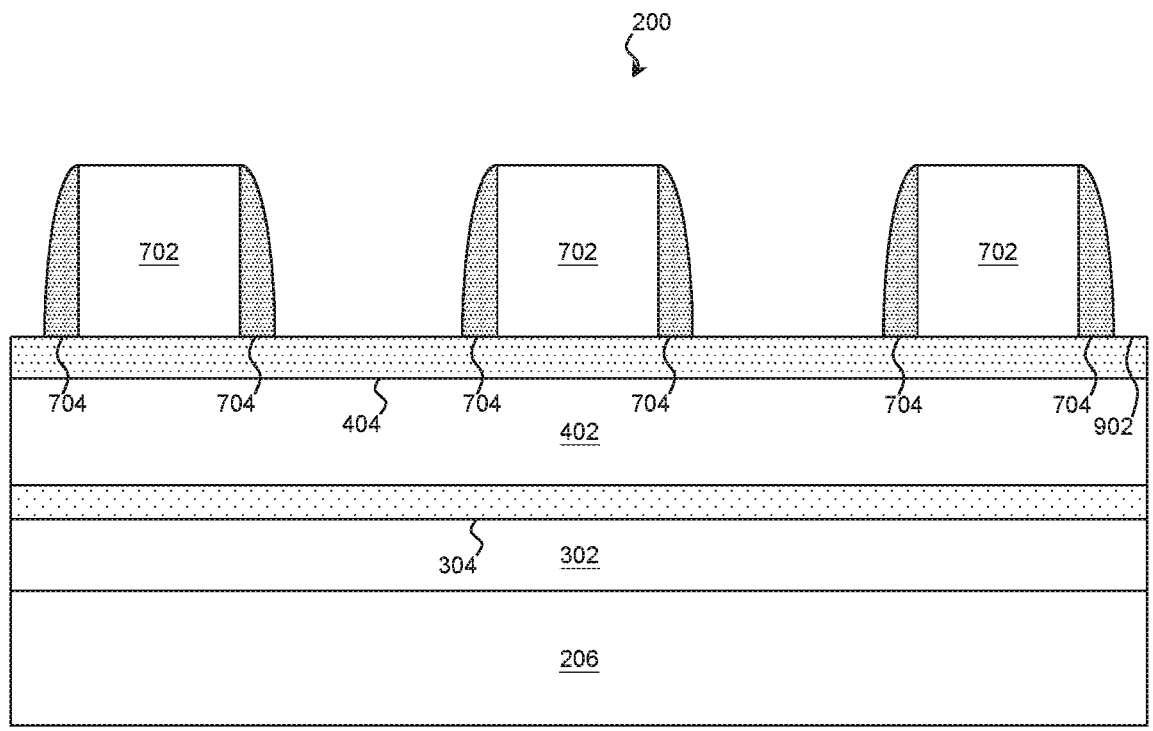

Referring to block 122 of FIG. 1B and to FIGS. 8A-8C, outside the capacitor region 212, an etching process is performed on the fins 208 to create recesses in the STI fill material 302 in which to form source/drain features.

Referring to block 124 of FIG. 1B and referring still to FIGS. 8A-8C, an epitaxy process is performed on the workpiece 200 to grow source/drain features 802 within the recesses. In various examples, the epitaxy process includes a CVD deposition technique (e.g., Vapor-Phase Epitaxy (VPE) and/or Ultra-High Vacuum CVD (UHV-CVD)), molecular beam epitaxy, and/or other suitable processes. The epitaxy process may use gaseous and/or liquid precursors, which interact with a component of the remaining fins 208 (e.g., silicon or silicon-germanium) to form the source/drain features 802. The semiconductor component of the source/drain features 802 may be similar to or different from the remainder of the fin 208. For example, Si-containing source/drain features 802 may be formed on a SiGe-containing fin 208 or vice versa. When the source/drain features 802 and fins 208 contain more than one semiconductor, the ratios may be substantially similar or different.

The source/drain features 802 may be in-situ doped to include p-type dopants, such as boron, $BF_2$, or indium; n-type dopants, such as phosphorus or arsenic; and/or other suitable dopants including combinations thereof. Additionally or in the alternative, the source/drain features 802 may be doped using an implantation process (i.e., a junction implant process) after the source/drain features 802 are formed. With respect to the particular dopant type, the source/drain features 802 are doped to be of opposite type than the remainder of the fins 208. For a p-channel device, the fin 208 is doped with an n-type dopant and the source/drain features 802 are doped with a p-type dopant, and vice versa for an n-channel device. Once the dopant(s) are introduced into the source/drain features 802, a dopant activation process, such as Rapid Thermal Annealing (RTA) and/or a laser annealing process, may be performed to activate the dopants.

Figure 9A:
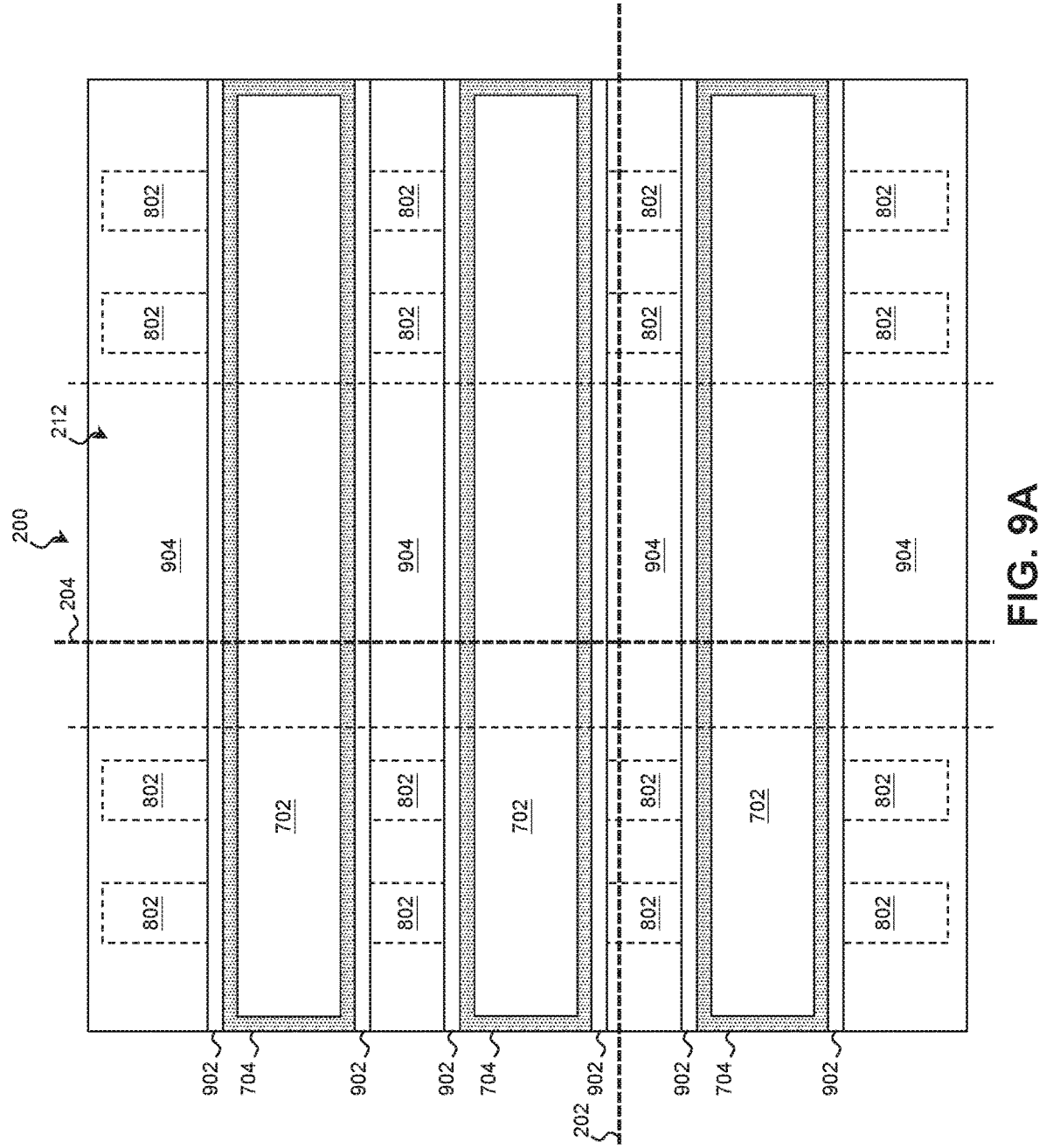
Figure 9B:
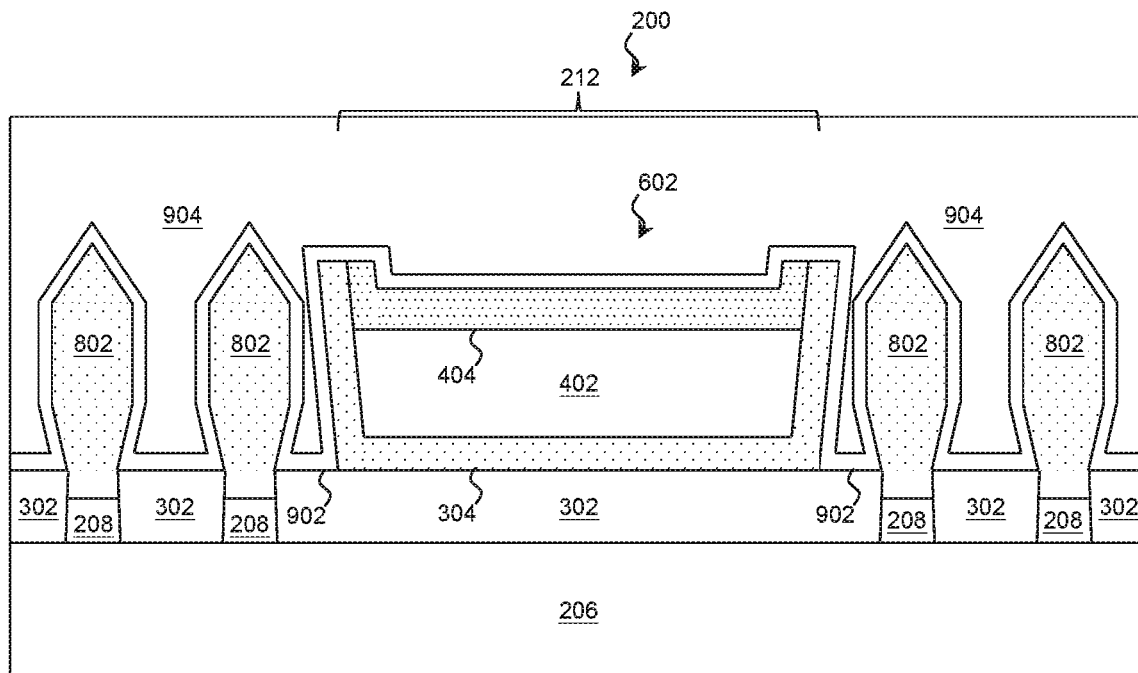
Figure 9C:
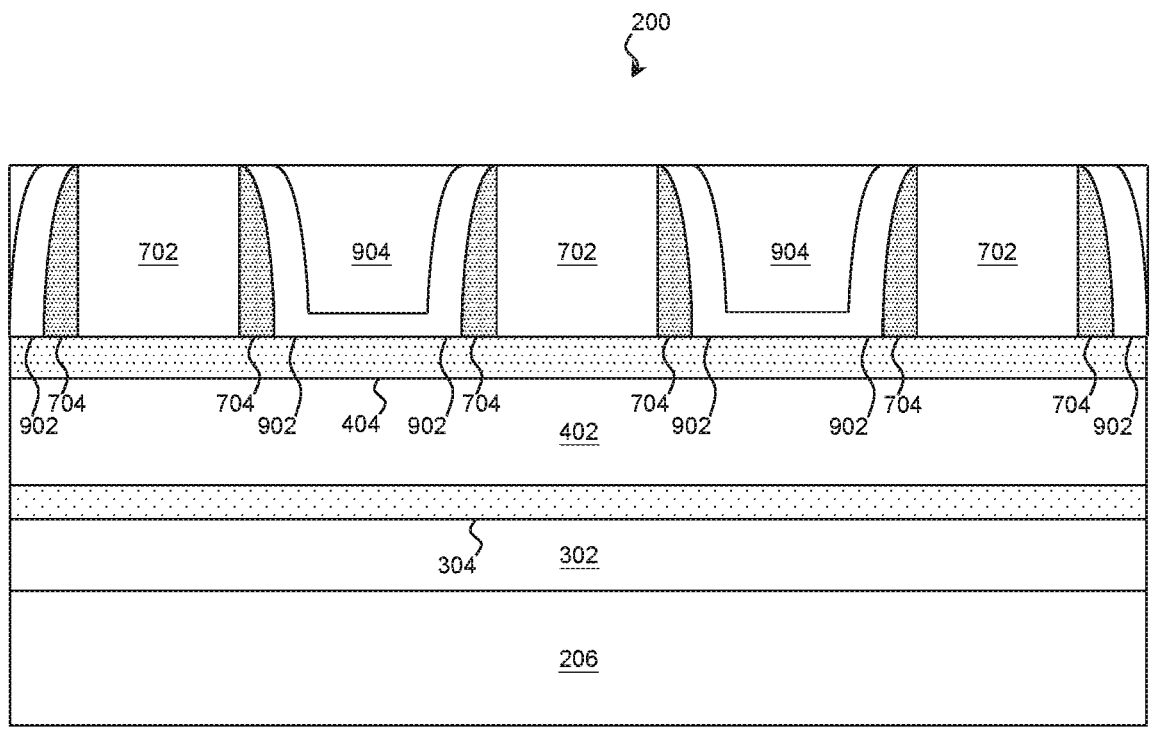

Referring to block 126 of FIG. 1B and to FIGS. 9A-9C, a contact etch stop layer (CESL) 902 may be formed on the gate spacers 704 and on the source/drain features 802. As illustrated in FIG. 9B, within the capacitor region 212, the CESL 902 may be deposited on and physically contact the horizontal and side portions of the third hard mask 404 and may also extend along and physically contact the outer surfaces of the side portions of the second hard mask 304. As illustrated in FIG. 9C, the CESL 902 may also extend along and physically contact the side surfaces of the gate spacers 704.

In various examples, the CESL 902 includes any suitable material, such as a dielectric material (e.g., a semiconductor oxide, a semiconductor nitride, a semiconductor oxynitride, a semiconductor carbide, a semiconductor oxycarbonitride, etc.), and/or other suitable material. As the CESL 902 acts as an etch stop, the material of the CESL 902 may be selected based on its etch resistance and/or etchant selectivity with respect to the surrounding materials, such as the gate spacers 704, the source/drain features 802, and the third hard mask 404. Furthermore, the portion of the CESL 902 formed in the capacitor region 212 may be part of a dielectric of the resulting capacitors, and the material(s) of the CESL 902 may be selected based on part on their dielectric constants. In some such examples, the CESL 902 includes silicon nitride, silicon carbide, silicon oxycarbide, and/or silicon carbonitride.

Because the CESL 902 may make up part of the capacitor dielectric, the thickness of the CESL 902 may affect the dielectric thickness (i.e., the plate gap) of the resulting capacitors, and the thickness may be selected accordingly. In various such examples, the CESL 902 is deposited to a thickness between about 5 nm and about 10 nm. The CESL 902 may be formed using any suitable deposition technique (e.g., CVD, HDP-CVD, ALD, etc.).

Referring to block 128 of FIG. 1B and referring still to FIGS. 9A-9C, a first Inter-Level Dielectric (ILD) layer 904 is formed on the workpiece 200. For reference, the source/drain features 802 underlying the first ILD layer 904 are shown using dashed lines in the top view of FIG. 9A. The first ILD layer 904 acts as an insulator that supports and isolates conductive traces of an electrical multi-level interconnect structure. In turn, the multi-level interconnect structure electrically interconnects elements of the workpiece 200, such as the source/drain features 802 and the gate structures and capacitors formed later. The first ILD layer 904 may include a dielectric material (e.g., a semiconductor oxide, a semiconductor nitride, a semiconductor oxynitride, a semiconductor carbide, etc.), SOG, fluoride-doped silicate glass (FSG), phosphosilicate glass (PSG), borophosphosilicate glass (BPSG), Black Diamond® (Applied Materials of Santa Clara, California), Xerogel, Aerogel, amorphous fluorinated carbon, parylene, BCB, SILK® (Dow Chemical of Midland, Michigan), and/or combinations thereof. The first ILD layer 904 may be formed by any suitable process including CVD, PVD, spin-on deposition, and/or other suitable processes.

Forming the first ILD layer 904 may include performing a CMP process on the workpiece 200 to remove the first ILD layer 904 and/or the CESL 902 from the top of the placeholder gates 702. The CMP process may be followed by an etch-back process to remove any remaining first ILD layer 904 material from the placeholder gates 702.

Figure 10A:
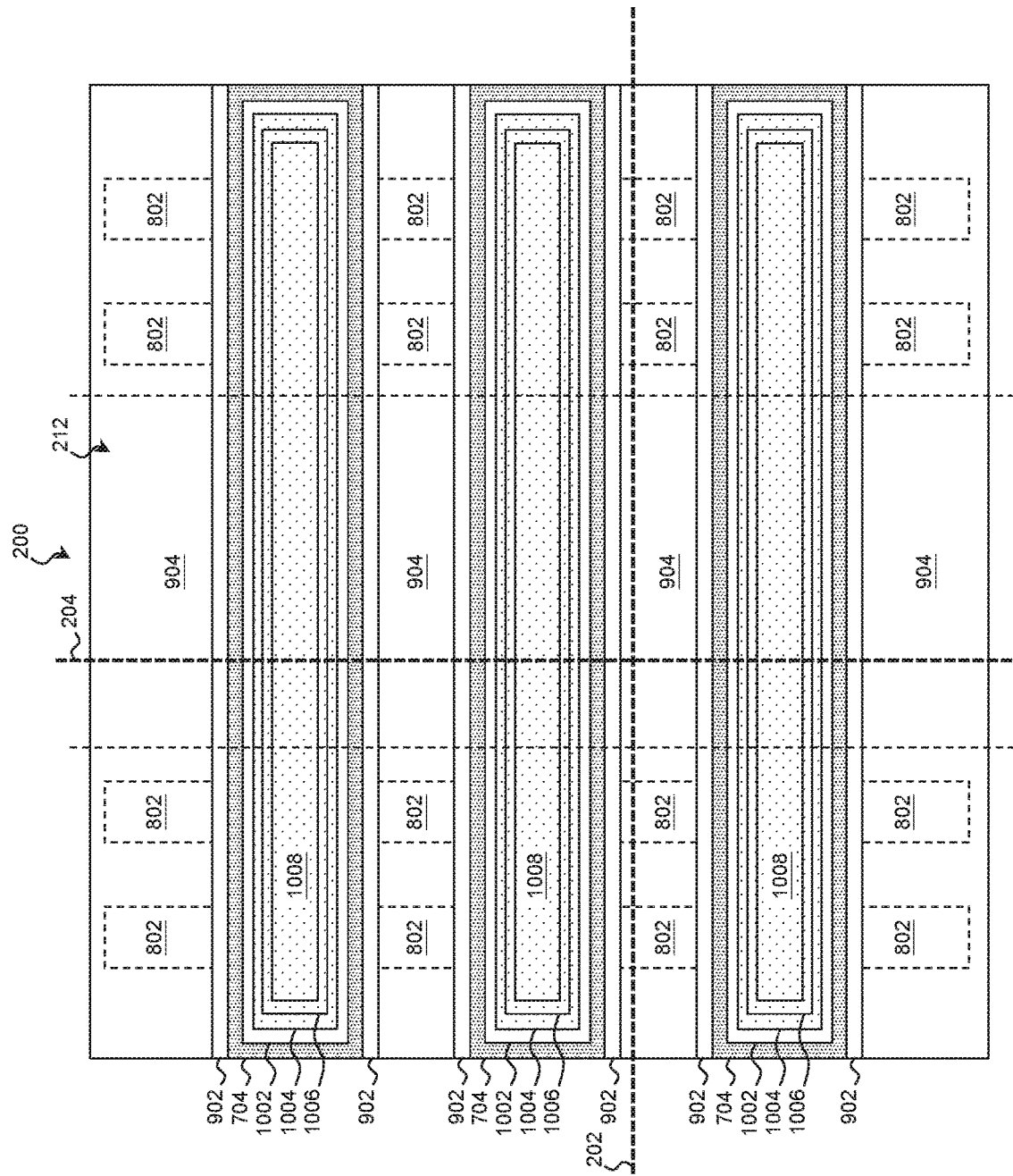
Figure 10B:
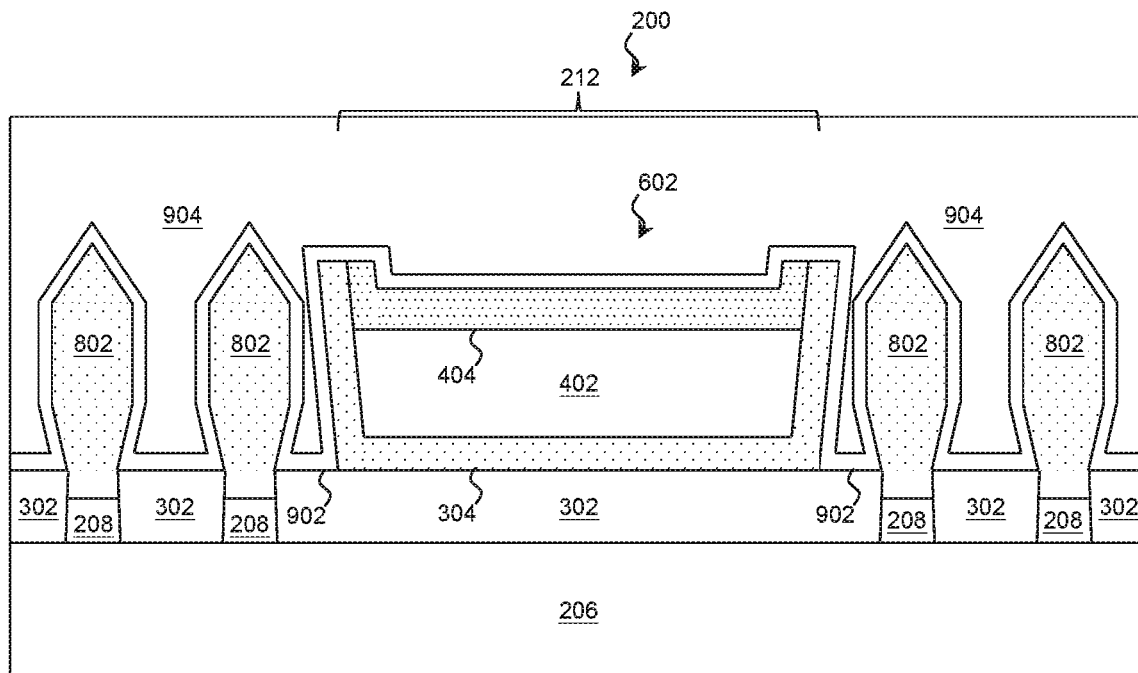
Figure 10C:
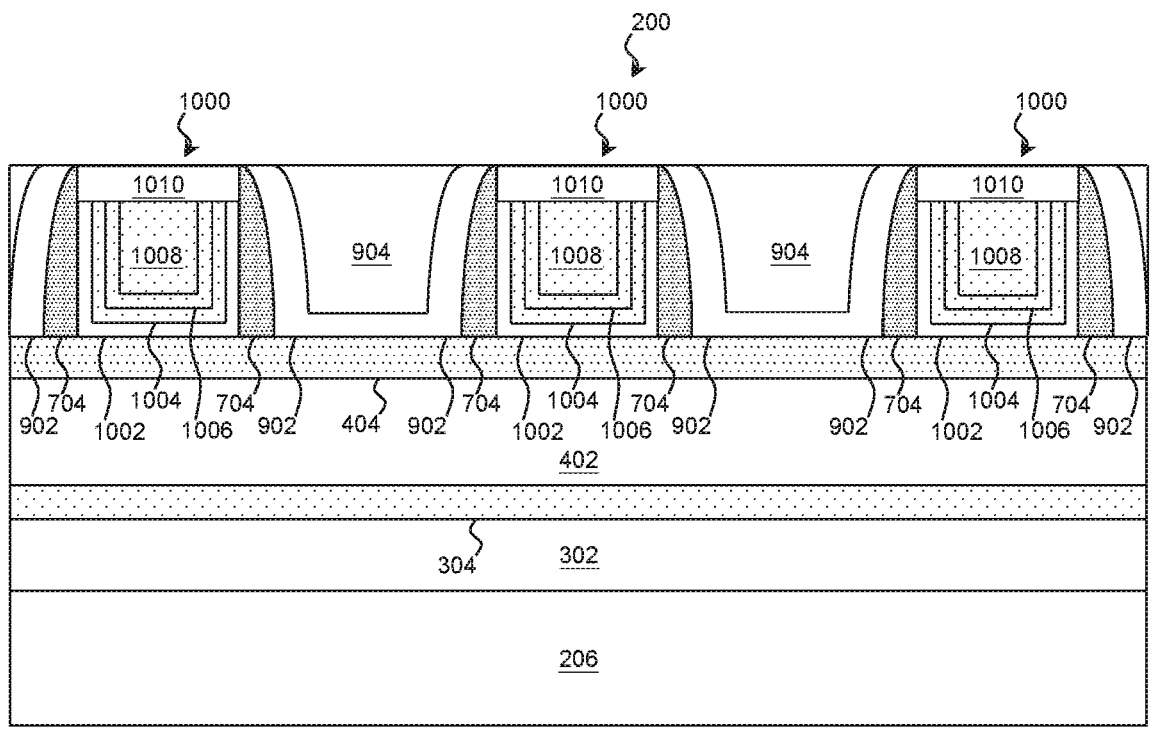

Referring to block 130 of FIG. 1B and to FIGS. 10A-10C, the placeholder gates 702 are removed as part of a gate replacement process to provide recesses between the gate spacers 704. Removing the placeholder gate material may include one or more etching processes (e.g., wet etching, dry etching, RIE) using an etchant chemistry configured to selectively etch the placeholder gate material without significant etching of the surrounding materials, such as the fins 208, the CESL 902, the source/drain features 802, the gate spacers 704, the first ILD layer 904, etc.

Referring to block 132 of FIG. 1B and referring still to FIGS. 10A-10C, functional gate structures are formed in the recesses defined by removing the placeholder gate material. The portions of the functional gate structures within the capacitor region 212 may define a first set of capacitor electrodes 1000. In other words, a single monolithic gate structure may have a first portion within the capacitor region 212 that forms a capacitor electrode 1000 and a second portion disposed on and around a channel region of a device fin 208 between opposing source/drain features 802 that forms a gate of a transistor.

In some examples, forming a functional gate structure includes forming an interfacial layer on the top and side surfaces of the fins 208 at the channel regions of the device fins 208. The interfacial layer may include an interfacial material, such as a semiconductor oxide, semiconductor nitride, semiconductor oxynitride, other semiconductor dielectrics, other suitable interfacial materials, and/or combinations thereof. The interfacial layer may be formed to any suitable thickness using any suitable process including thermal growth, ALD, CVD, HDP-CVD, PVD, spin-on deposition, and/or other suitable deposition processes. In some examples, the interfacial layer is formed by a thermal oxidation process and includes a thermal oxide of a semiconductor present in the fins 208 (e.g., silicon oxide for silicon-containing fins 208, silicon-germanium oxide for silicon-germanium-containing fins 208, etc.).

Forming the functional gate structure may include forming a gate dielectric 1002 on the interfacial layer and the third hard mask 404. The gate dielectric 1002 may also be formed along the vertical surfaces of the gate spacers 704. In this way, portions of the gate dielectric 1002 formed in the capacitor region 212 may be part of the dielectric of the resulting capacitors, and the material of the gate dielectric 1002 may be selected based on part on its dielectric constant. The gate dielectric 1002 may include one or more dielectric materials, which are commonly characterized by their dielectric constant relative to silicon oxide. In some embodiments, the gate dielectric 1002 includes a high-k dielectric material, such as $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. Additionally or in the alternative, the gate dielectric 1002 may include other dielectrics, such as a semiconductor oxide, semiconductor nitride, semiconductor oxynitride, semiconductor carbide, amorphous carbon, TEOS, other suitable dielectric material, and/or combinations thereof.

The gate dielectric 1002 may be formed using any suitable process including ALD, Plasma Enhanced ALD (PEALD), CVD, Plasma Enhanced CVD (PE CVD), HDP-CVD, PVD, spin-on deposition, and/or other suitable deposition processes. The gate dielectric 1002 may be formed to any suitable thickness. Because the gate dielectric 1002 may make up part of the capacitor dielectric, the thickness of the gate dielectric 1002 may affect the dielectric thickness (i.e., the plate gap) of the resulting capacitors, and the thickness may be selected accordingly. In some examples, the gate dielectric 1002 has a thickness of between about 1 nm and about 3 nm.

Forming the functional gate structure may include forming a gate electrode on the workpiece 200. The gate electrode may include a number of different conductive layers, of which three exemplary layers (a capping layer 1004, work function layer(s) 1006, and electrode fill 1008) are shown. With respect to the first layer, in some examples, forming a gate electrode includes forming a capping layer 1004 on the workpiece 200. The capping layer 1004 may be formed directly on the gate dielectric 1002. The capping layer 1004 may include any suitable conductive material including metals (e.g., W, Al, Ta, Ti, Ni, Cu, Co, etc.), metal nitrides, and/or metal silicon nitrides, and may be deposited via CVD, ALD, PE CVD, PEALD, PVD, and/or other suitable deposition processes. In various embodiments, the capping layer 1004 includes TaSiN, TaN, and/or TiN.

In some examples, forming a gate electrode includes forming one or more work function layers 1006 on the capping layer 1004. Suitable work function layer 1006 materials include n-type and/or p-type work function materials based on the type of device to which the gate structure corresponds. Exemplary p-type work function metals include TiN, TaN, Ru, Mo, Al, WN, $ZrSi_2$, $MoSi_2$, $TaSi_2$, $NiSi_2$, WN, other suitable p-type work function materials, and/or combinations thereof. Exemplary n-type work function metals include Ti, Ag, TaAl, TaAlC, TiAlN, TaC, TaCN, TaSiN, Mn, Zr, other suitable n-type work function materials, and/or combinations thereof. The work function layer(s) 1006 may be deposited by any suitable technique including ALD, CVD, PE CVD, PEALD, PVD, and/or combinations thereof. Because the p-type and n-type devices may have different work function layers 1006, in some examples, the n-type work function layers 1006 are deposited in a first deposition process that uses a dielectric hard mask to prevent depositing on the electrodes of the p-type devices, and the p-type work function layers 1006 are deposited in a second deposition process that uses a dielectric hard mask to prevent depositing on the electrodes of the n-type devices. The gate electrodes formed in the capacitor region 212 may have either type of work function layer 1006, and the type of work function layer 1006 may be the same as that of the devices formed on the adjacent fins 208.

In some examples, forming a gate electrode includes forming an electrode fill 1008 on the work function layer(s) 1006. The electrode fill 1008 may include any suitable material including metals (e.g., W, Al, Ta, Ti, Ni, Cu, Co, etc.), metal oxides, metal nitrides and/or combinations thereof, and in an example, the electrode fill includes tungsten. The electrode fill 1008 may be deposited by any suitable technique including ALD, CVD, PE CVD, PEALD, PVD, and/or combinations thereof.

A CMP process may be performed to remove electrode material (e.g., material of: the capping layer 1004, the work function layer(s) 1006, the electrode fill 1008, etc.) that is outside of the gate structures.

In some examples, forming the gate structures includes partially recessing the gate structures (e.g., the gate dielectric 1002, the capping layer 1004, the work function layer(s) 1006, the electrode fill 1008, etc.) and forming a gate cap 1010 on the recessed gate structures. The gate cap 1010 is omitted from the top view of FIG. 10A to avoid obscuring the remainder of the gate structures. The gate cap 1010 may include any suitable material, such as: a dielectric material (e.g., a semiconductor oxide, a semiconductor nitride, a semiconductor oxynitride, a semiconductor carbide, a semiconductor oxycarbonitride, etc.), and/or other suitable material. In some examples, the gate cap 1010 includes silicon oxycarbonitride. The gate cap 1010 may be formed to any suitable thickness using any suitable deposition technique (e.g., CVD, HDP-CVD, ALD, etc.). In some examples, the gate cap 1010 has a thickness between about 1 nm and about 10 nm, and is deposited by a CVD and/or ALD process.

Contacts are then formed that couple to the source/drain features 802. The portions of the contacts within the capacitor region 212 define a second set of capacitor electrodes 1204. Similar to the gate structures, a single monolithic contact may have a first portion within the capacitor region 212 that forms a capacitor electrode 1204 and a second portion disposed on and around a source/drain feature 802 to form a source/drain contact.

Figure 11A:
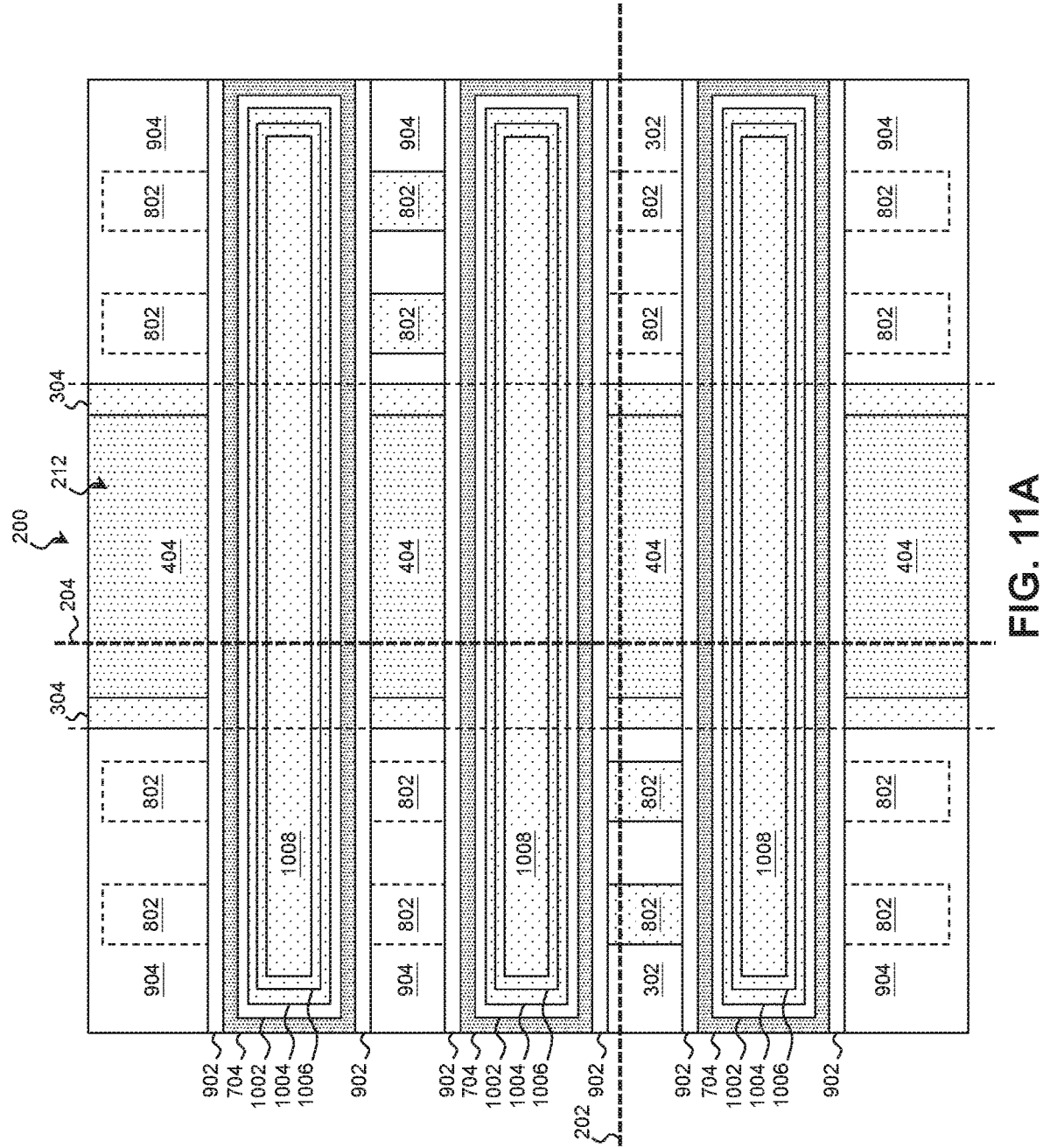
Figure 11B:
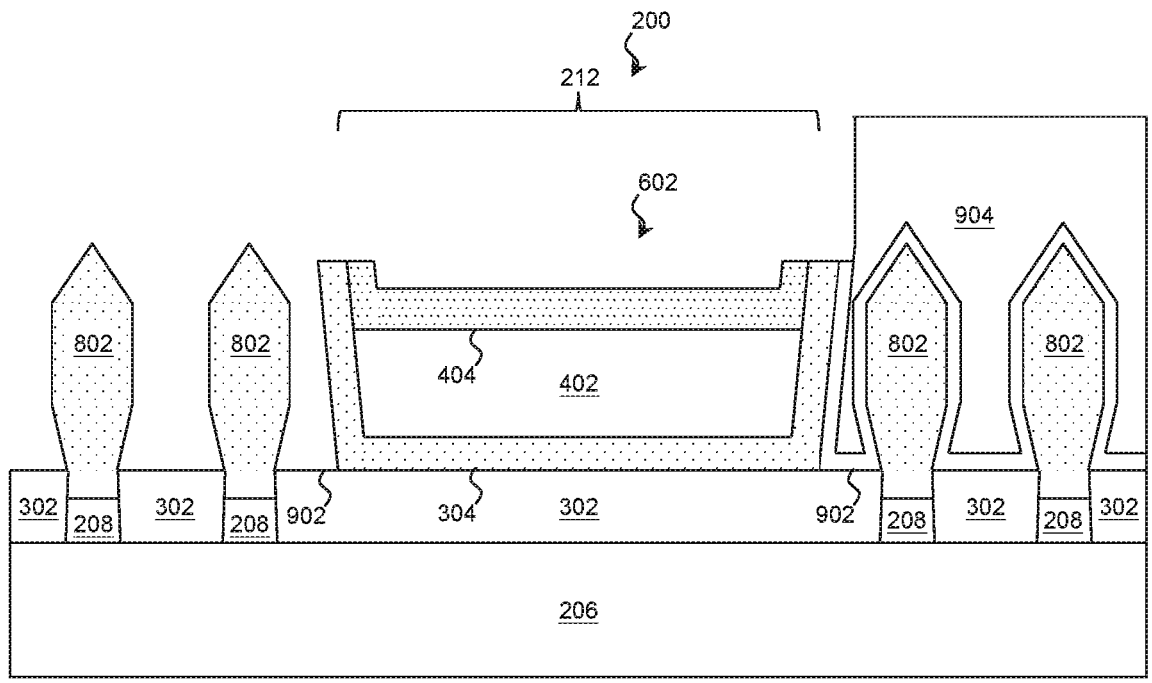
Figure 11C:
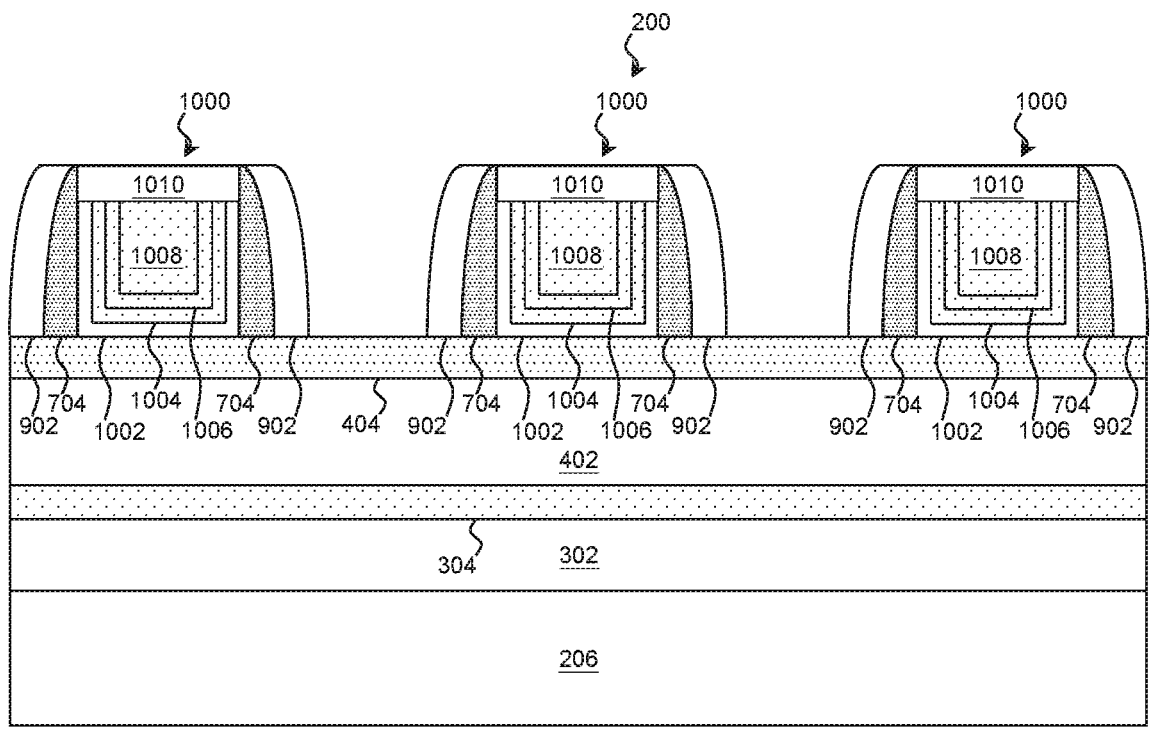

Referring to block 134 of FIG. 1B and to FIGS. 11A-11C, contact holes are opened in the first ILD layer 904 and the CESL 902 where the contacts are to couple to the source/drain features 802. Contact holes are also opened in the capacitor region 212, where the second set of capacitor electrodes 1204 is to be formed. This may include one or more iterations of: applying a photoresist, exposing the photoresist, developing the photoresist, and etching the exposed portions of the first ILD layer 904 and the CESL 902. Each of these processes may be performed substantially as described above.

It has been determined that some STI materials, such as semiconductor oxides, are sensitive to the etching processes used to open the first ILD layer 904 and/or the CESL 902. These processes may cause unintended etching of the STI materials and may do so unevenly, leading to irregular features, particularly when forming the capacitor electrodes 1204. However, in many of the present embodiments, because the elevated isolation structure 602 includes alternative materials, such as the third hard mask 404, the isolation structure 602 may be more resilient to these etching techniques. This may avoid over-etching. As a result, such examples produce more uniform capacitor features and thereby provide more uniform capacitor behavior.

Figure 12A:
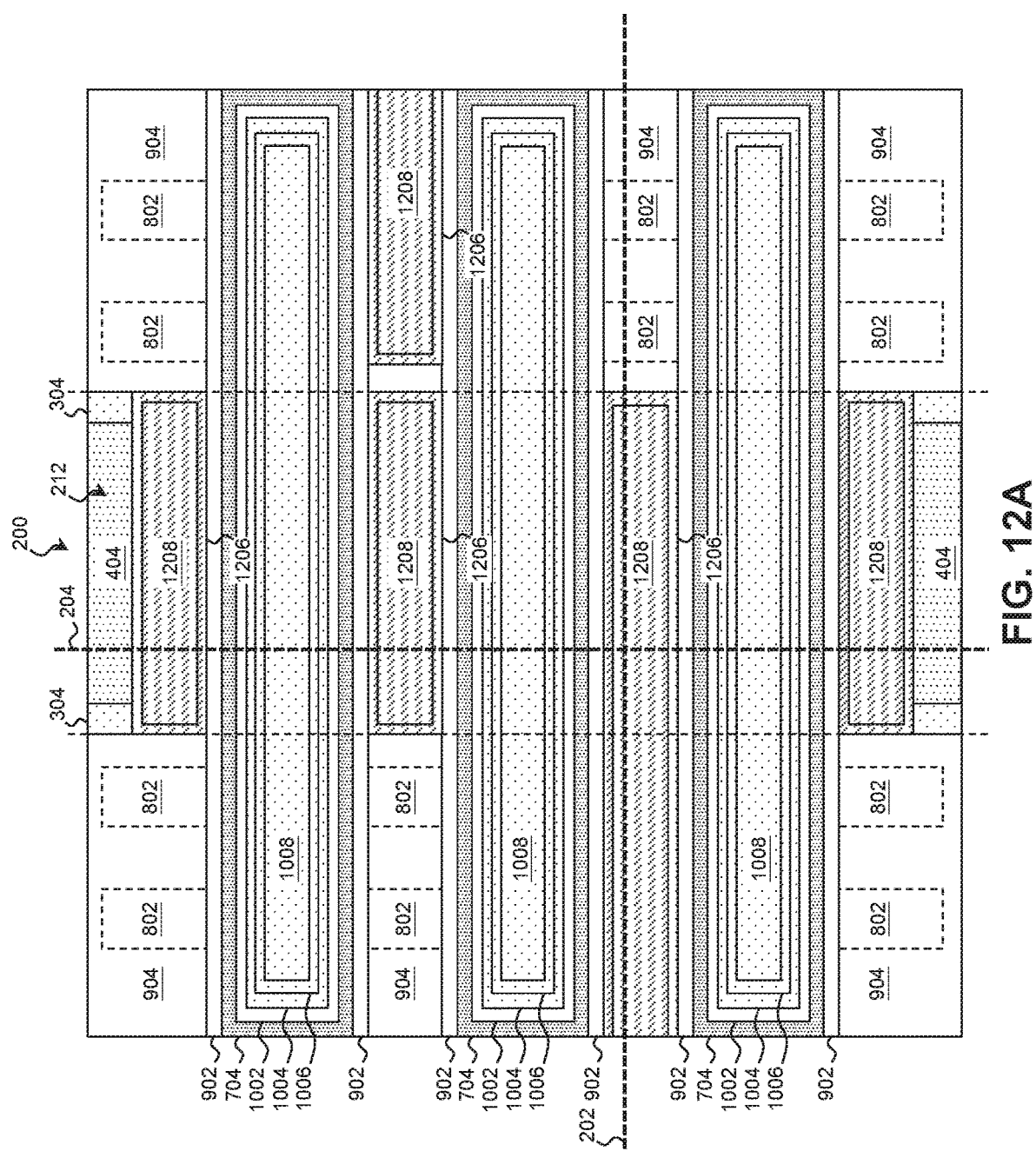
Figure 12B:
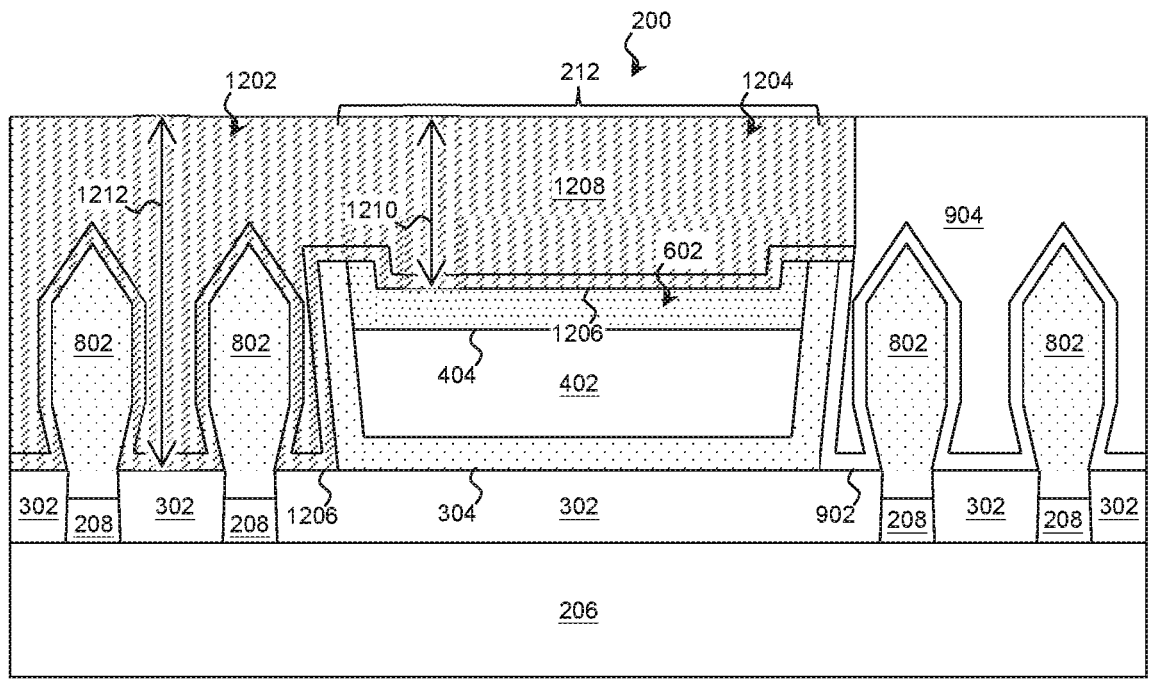
Figure 12C:
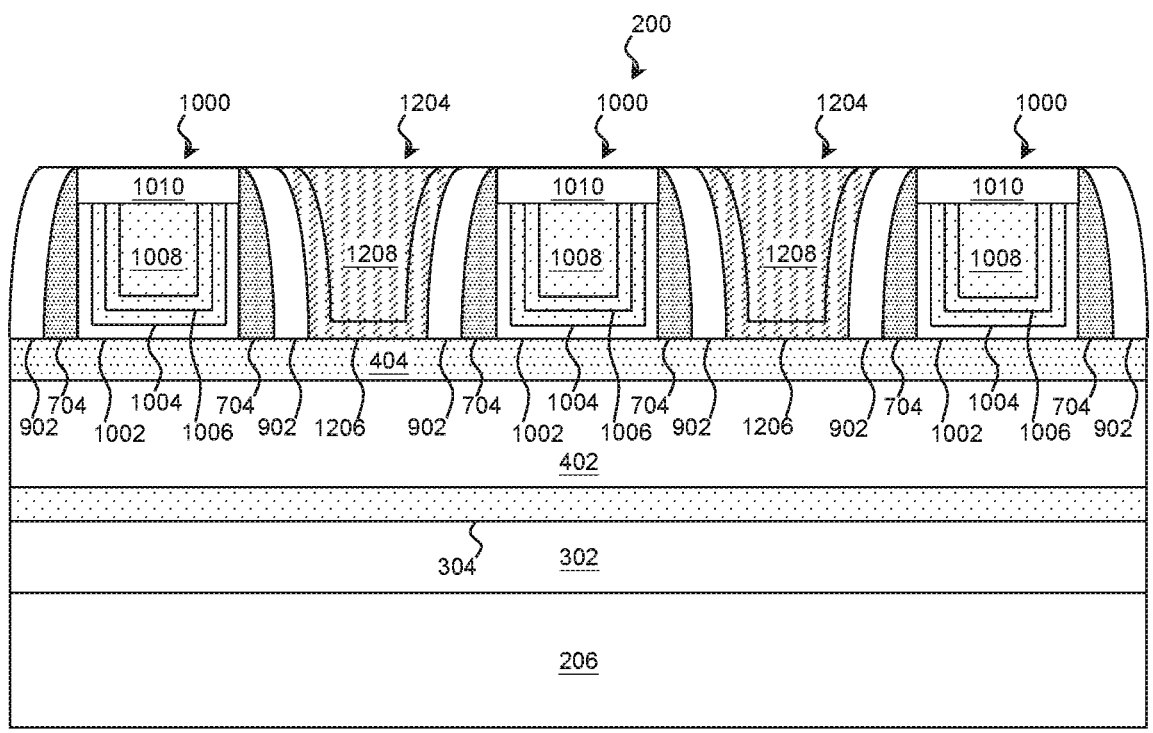

Referring to block 136 of FIG. 1B and to FIGS. 12A-12C, source/drain contacts 1202 are formed extending through recesses in the first ILD layer 904 and CESL 902 that physically and electrically couple to the source/drain features 802. In this way, the source/drain contacts 1202 electrically connect their respective source/drain features 802 to upper level conductors and may also directly electrically connect source/drain features 802 to each other. Forming the source/drain contacts 1202 also forms the second set of capacitor electrodes 1204 in those recesses located in the capacitor region 212. In the example of FIG. 12B, a single structure forms both a source/drain contact 1202 and an electrode 1204.

The source/drain contacts 1202 and capacitor electrodes 1204 may include a number of conductive layers. In one such example, forming the source/drain contacts 1202 and electrodes 1204 includes forming a metal silicide layer (e.g., NiSi, NiSiGe, etc.) on the source/drain features 802. To do so, a metal component of the metal silicide layer may be deposited by any suitable technique including PVD (e.g., sputtering), CVD, PE CVD, ALD, PEALD, and/or combinations thereof and then annealed to diffuse the metal into a semiconductor material (e.g., silicon, silicon-germanium, etc.) of the source/drain features 802.

Continuing the example, a glue layer 1206 (also referred to as an adhesion layer) is formed on the metal silicide layer of the source/drain features 802. Within the capacitor region 212, the glue layer 1206 is disposed on and physically contacts the horizontal and side portions of the third hard mask 404 and physically contacts a top surface of the second hard mask 304. The glue layer 1206 may extend between a source/drain feature 802 and an outer surface of a side portion of the second hard mask 304 at an end of the capacitor region 212 and may contact the STI material 302 between the source/drain feature 802 and the second hard mask 304.

The glue layer 1206 may improve the formation of the contacts 1202 and capacitor electrodes 1204 by enhancing wettability, increasing adhesion, and/or preventing diffusion. The glue layer 1206 may include a metal (e.g., W, Al, Ta, Ti, Ni, Cu, Co, etc.), a metal nitride, a metal oxide, other suitable conductive material, and/or other suitable glue material. The glue layer 1206 may be formed by any suitable process including ALD, CVD, LPCVD, PECVD, PVD, and/or other suitable techniques. In some examples, the glue layer 1206 includes Ti or TiN formed by ALD using tetrakis-dimethylamino titanium (TDMAT) as a titanium-containing precursor. The glue layer 1206 may be formed to any suitable thickness and, in some examples, has a substantially uniform thickness selected to be between about 10 Angstroms and about 100 Angstroms.

In the above example, forming the source/drain contacts 1202 and capacitor electrodes 1204 in block 136 includes forming a fill material 1208 on the glue layer 1206. The fill material 1206 may extend between source/drain features 802 and between a source/drain feature 802 and an outer surface of a side portion of the second hard mask 304 at an end of the capacitor region 212.

The fill material 1208 may include a metal, a metal nitride, a metal oxide, and/or other suitable conductive material. In various examples, the fill material 1208 includes copper, cobalt, tungsten, and/or combinations thereof. The fill material 1208 may be formed by any suitable process including CVD, LPCVD, PECVD, PVD, ALD, and/or other suitable techniques. In an example, the fill material 1208 is deposited by alternating PVD and CVD cycles.

Referring still to block 136, forming the source/drain contacts 1202 may include performing a thermal reflow process on the workpiece 200. The thermal reflow process may include a thermal annealing to eliminate voids or striations within the source/drain contacts 1202. The thermal reflow process may include heating the workpiece 200 to any suitable temperature and, in various examples, includes heating the workpiece 200 to a temperature between about 300° C. and about 500° C. A planarization process may be performed to remove portions of the source/drain contacts 1202 extending above the top of the first ILD layer 904.

As a result of the isolation structure 602, the thickness of the conductive materials (e.g., glue layer 1204 and fill material 1206) in the capacitor electrodes 1204, represented by marker 1210, may be significantly less than the thickness of the conductive materials in the source/drain contacts 1202, represented by marker 1212. In various such examples, the thickness 1210 of the conductive materials over the isolation structure 602 is between about 30 nm and about 40 nm, and the thickness 1212 of the conductive materials in the source/drain contacts 1202 is between about 80 nm and about 120 nm.

Figure 13:
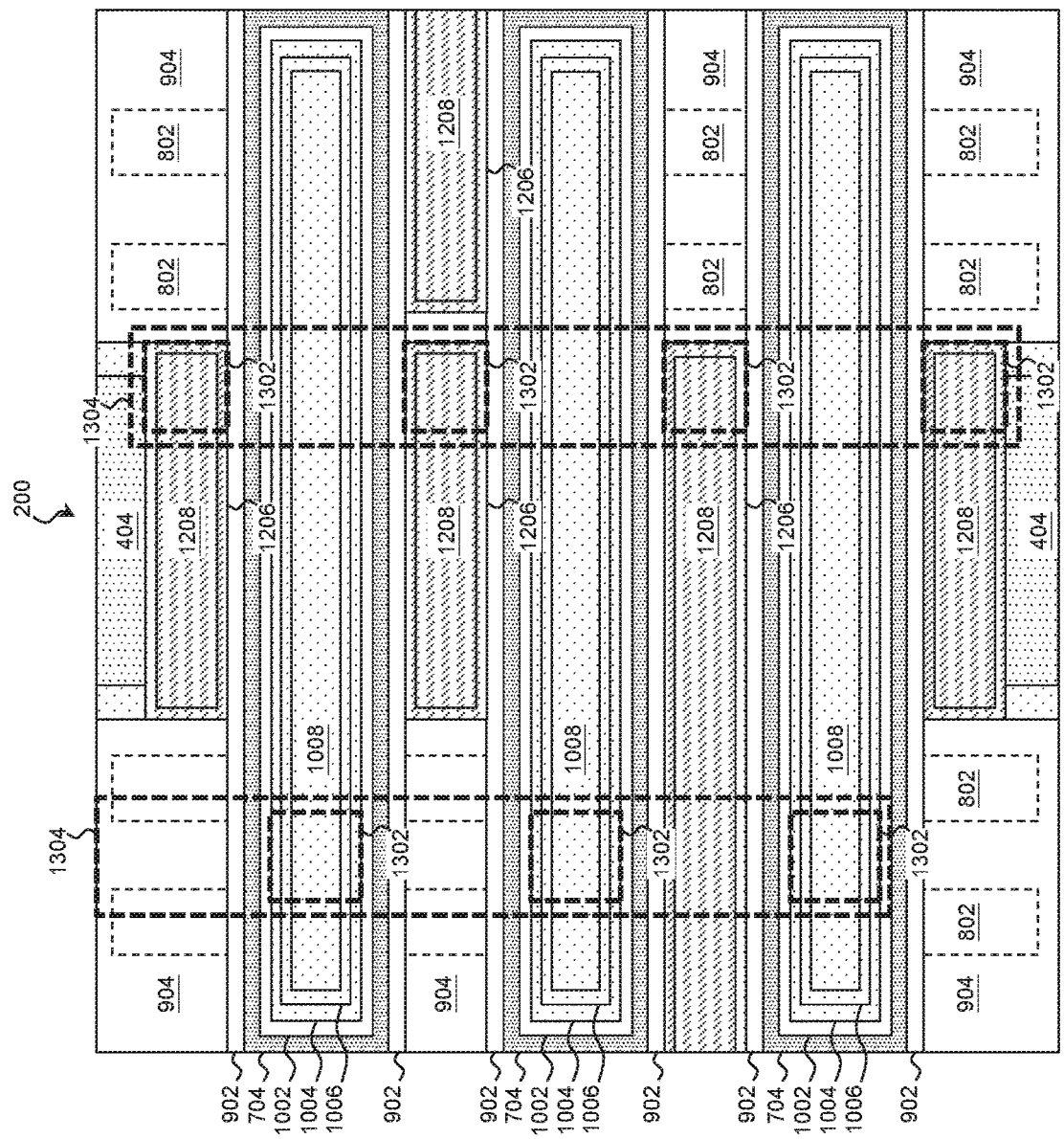

Referring to block 138 of FIG. 1B and to FIG. 13, the workpiece 200 is provided for further fabrication. In various examples, further fabrication includes forming a remainder of an electrical interconnect structure, dicing, packaging, and other fabrication processes. In some such examples, contacts 1302 are formed that couple to the source/drain contacts 1202, the capacitor electrodes 1204, and to the gate structures. The contacts 1302 may be substantially similar in composition to the source/drain contacts 1202 and/or capacitor electrodes 1204 and may be formed by substantially similar processes. The contacts 1302 may couple to conductive interconnects 1304, which may be formed as part of block 138. Like the contacts, the conductive interconnects 1304 may be substantially similar in composition to the source/drain contacts 1202 and/or capacitor electrodes 1204 and may be formed by substantially similar processes.

Thus, the present disclosure provides examples of an integrated circuit with capacitor structure and a method for forming the integrated circuit. In some examples, an integrated circuit device includes a substrate and a trench isolation material disposed on the substrate. An isolation structure is disposed on the trench isolation material. A first electrode disposed on the isolation structure, and a second electrode disposed on the isolation structure. A capacitor dielectric is disposed on the isolation structure between the first electrode and the second electrode. In some such examples, a plurality of device fins is disposed on the substrate such that the isolation structure is disposed between the plurality of device fins. In some such examples, the first electrode is further disposed over a first device fin of the plurality of device fins to form a gate of a transistor. In some such examples, the second electrode is further disposed over a source/drain feature of a first device fin of the plurality of device fins to form a source/drain contact electrically coupled to the source/drain feature. In some such examples, the trench isolation material extends between the plurality of device fins. In some such examples, a material at a top surface of the isolation structure is different from the trench isolation material. In some such examples, the isolation structure includes a first hard mask disposed on the trench isolation material, a dielectric disposed on the first hard mask, and a second hard mask disposed on the dielectric. The second hard mask has a different composition from the STI material. In some such examples, a first portion of the second electrode physically contacts the isolation structure and a second portion of the second electrode physically contacts the trench isolation material. In some such examples, the first electrode is a transistor gate, the second electrode is a source/drain contact, and the capacitor dielectric includes a gate spacer of the transistor gate and a contact etch stop layer.

In further examples, a device includes a substrate, a plurality of fins disposed on the substrate, an isolation structure disposed on the substrate between the plurality of fins, a first electrode disposed on the isolation structure that forms a transistor gate, a second electrode disposed on the isolation structure that forms a source/drain contact, and a dielectric disposed between the first electrode and the second electrode. In some such examples, the dielectric includes a gate spacer disposed on a side surface of the first electrode. In some such examples, the dielectric further includes a contact etch stop layer disposed between the gate spacer and the second electrode. In some such examples, a shallow trench isolation (STI) material is disposed between the plurality of fins and between the isolation structure and the substrate. In some such examples, a material at a top surface of the isolation structure is different in composition from the trench isolation material. In some such examples, a first portion of the second electrode is disposed on the isolation structure and a second portion of the second electrode is disposed on the trench isolation material. In some such examples, a bottom surface of the first portion of the second electrode is above a bottom surface of the second portion of the second electrode.

In yet further examples, a method includes receiving a substrate having a plurality of fins extending from the substrate. An isolation dielectric (i.e. a dielectric isolation material) is formed on the substrate between the plurality of fins. An isolation structure is formed on the isolation dielectric. A gate structure is formed on the isolation structure to define a first electrode of a capacitor, and a source/drain contact is formed on the isolation structure to define a second electrode of the capacitor. In some such examples, the forming of the isolation structure includes, forming a first hard mask layer on the isolation dielectric, forming a dielectric material on the first hard mask layer, and forming a second hard mask layer on the dielectric material. In some such examples, the forming of the source/drain contact includes etching to expose the second hard mask layer and the isolation dielectric. In some such examples, the second hard mask layer and the isolation dielectric have different etchant sensitivities.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first fin disposed on a substrate;
   a first source/drain feature disposed on the first fin;
   an isolation structure disposed on the substrate, the isolation structure having a side surface facing the first source/drain feature and a top surface facing away from the substrate;
   a dielectric isolation material disposed on the substrate and interfacing with the first fin and the isolation structure; and
   a first electrode disposed on and interfacing with the first source/drain feature, the side surface of the isolation structure, the top surface of the isolation structure and the dielectric isolation material.

2. The device of claim 1, wherein the first electrode includes an adhesion layer and a conductive fill layer disposed on the adhesion layer.

3. The device of claim 2, wherein the first source/drain feature includes a silicide layer.

4. The device of claim 1, further comprising:
   a second fin disposed on the substrate adjacent the first fin; and
   a second source/drain feature disposed on the second fin, and
   wherein the first electrode further interfaces with the second source/drain feature.

5. The device of claim 1, wherein the first source/drain feature interfaces with a top surface of a first portion of the first fin, and
   wherein the dielectric isolation material extends to a greater height above the substrate than the top surface of the first portion of the first fin.

6. The device of claim 1, further comprising:
   a second fin disposed on the substrate;
   a second source/drain feature disposed on the second fin; and
   wherein the isolation structure is positioned between the first fin and the second fin.

7. The device of claim 1, wherein the isolation structure is formed of multiple material layers.

8. The device of claim 1, wherein the first source/drain feature extends to a greater height above the substrate than the isolation structure.

9. A device comprising:
   a first semiconductor fin and a second semiconductor fin disposed on a substrate;
   a first source/drain feature disposed on the first semiconductor fin;
   a second source/drain feature disposed on the second semiconductor fin;
   a shallow trench isolation (STI) fill material disposed on the substrate and interfacing with the first semiconductor fin and the second semiconductor fin;
   an isolation structure disposed on and interfacing with the STI fill material; and
   a conductive material layer disposed on and interfacing with the first source/drain feature, the STI fill material, and a top surface of the isolation structure.

10. The device of claim 9, wherein the conductive material layer includes an adhesion layer disposed on a top surface of the STI fill material and a conductive fill layer spaced apart from the top surface of the STI fill material by the adhesion layer.

11. The device of claim 9, further comprising a first gate stack disposed on the first semiconductor fin and the isolation structure.

12. The device of claim 11, wherein the first gate stack includes a gate dielectric material layer interfacing with the isolation structure.

13. The device of claim 9, wherein the isolation structure includes:
   a first hard mask layer disposed directly on the STI fill material,
   a first dielectric material layer disposed directly on the first hard mask layer, and
   a second hard mask layer disposed directly on the first dielectric material layer.

14. The device of claim 13, wherein a portion of the second hard mask layer interfaces with the first hard mask layer.

15. The device of claim 9, further comprising an etch stop layer interfacing with the isolation structure and the conductive material layer.

16. A method comprising:

forming a first fin over a substrate;

forming a dielectric isolation material over the first fin thereby covering the first fin, the dielectric isolation material being in contact with the substrate;

forming a recess into the dielectric isolation material;

forming an isolation structure in the recess;

after the forming of the isolation structure, planarizing the dielectric isolation material and the first fin such that top surfaces of the first fin and the dielectric isolation material are coplanar;

after the planarizing, removing a portion of the dielectric isolation material to expose sidewalls of the first fin and the isolation structure;

forming a source/drain feature on the first fin; and forming a conductive material layer extending from the dielectric isolation material to over the first source/drain feature, wherein a portion of the conductive material layer is disposed between the isolation structure and the source/drain feature.

17. The method of claim 16, wherein the conductive material layer interfaces with the dielectric isolation material and the isolation structure after the forming of the conductive material layer.

18. The method of claim 17, wherein the conductive material layer interfaces with the source/drain feature after the forming of the conductive material layer.

19. The method of claim 16, wherein the removing of the portion of the dielectric isolation material to expose the first fin further includes removing a portion of the isolation structure.

20. The method of claim 16, further comprising:

forming a first gate stack over the first fin; and performing a gate replacement process on the first gate stack to form a second gate stack prior to the forming of the conductive material layer extending from the dielectric isolation material to over the first fin.

* * * * *